United States Patent
Kim et al.

(10) Patent No.: US 8,552,472 B2
(45) Date of Patent: Oct. 8, 2013

(54) INTEGRATED CIRCUIT DEVICES INCLUDING VERTICAL CHANNEL TRANSISTORS WITH SHIELD LINES INTERPOSED BETWEEN BIT LINES AND METHODS OF FABRICATING THE SAME

(75) Inventors: Hui-jung Kim, Seongnam-si (KR); Yong-chul Oh, Suwon-si (KR); Yoo-sang Hwang, Suwon-si (KR); Hyun-woo Chung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 223 days.

(21) Appl. No.: 13/155,688

(22) Filed: Jun. 8, 2011

(65) Prior Publication Data

US 2011/0303974 A1    Dec. 15, 2011

(30) Foreign Application Priority Data

Jun. 14, 2010 (KR) .................. 10-2010-0056190

(51) Int. Cl.
*H01L 27/10* (2006.01)
*H01L 29/778* (2006.01)
*H01L 27/105* (2006.01)

(52) U.S. Cl.
CPC .................................. *H01L 29/7788* (2013.01)
USPC ........... 257/242; 257/302; 257/328; 257/329; 257/E27.096; 257/E29.262; 257/E29.274; 438/138; 438/268

(58) Field of Classification Search
CPC .................................................. H01L 29/7788
USPC ................ 257/242, 278, 302, 388, E27.057, 257/E27.096, E29.183, E29.26, E29.262, 257/E29.274, E29.313, E29.318, E21.375, 257/E21.41, E21.418, E21.447, E21.629, 257/E21.643; 438/137–138, 173, 192, 206, 438/209, 212, 268
See application file for complete search history.

(56) References Cited

U.S. PATENT DOCUMENTS

| | | | | |
|---|---|---|---|---|
| 6,114,725 A * | 9/2000 | Furukawa et al. | ............ | 257/330 |
| 6,348,722 B1 * | 2/2002 | Yoshikoshi | ................... | 257/508 |
| 7,348,628 B2 * | 3/2008 | Yoon et al. | .................... | 257/328 |
| 7,531,412 B2 * | 5/2009 | Yoon et al. | .................... | 438/270 |
| 7,564,084 B2 * | 7/2009 | Song et al. | .................... | 257/296 |
| 7,586,149 B2 * | 9/2009 | Yoon et al. | .................... | 257/329 |
| 7,759,198 B2 * | 7/2010 | Seo et al. | ....................... | 438/268 |
| 7,781,287 B2 * | 8/2010 | Yoon et al. | .................... | 438/272 |
| 7,964,914 B2 * | 6/2011 | Jung | ............................. | 257/331 |
| 8,105,902 B2 * | 1/2012 | Shin | ............................. | 438/269 |

(Continued)

FOREIGN PATENT DOCUMENTS

| | | |
|---|---|---|
| KR | 1020090098176 A | 9/2009 |
| KR | 1020090098211 A | 9/2009 |
| KR | 1020090122744 A | 12/2009 |

*Primary Examiner* — Matthew Landau
*Assistant Examiner* — Maliheh Malek
(74) *Attorney, Agent, or Firm* — Myers Bigel Sibley & Sajovec

(57) ABSTRACT

An integrated circuit device includes a plurality of pillars protruding from a substrate in a first direction. Each of the pillars includes source/drain regions in opposite ends thereof and a channel region extending between the source/drain regions. A plurality of conductive bit lines extends on the substrate adjacent the pillars in a second direction substantially perpendicular to the first direction. A plurality of conductive shield lines extends on the substrate in the second direction such that each of the shield lines extends between adjacent ones of the bit lines. Related fabrication methods are also discussed.

18 Claims, 26 Drawing Sheets

(56) References Cited

U.S. PATENT DOCUMENTS

| | | | |
|---|---|---|---|
| 8,188,517 B2 * | 5/2012 | Choi | 257/211 |
| 8,237,220 B2 * | 8/2012 | Sung et al. | 257/328 |
| 8,293,604 B2 * | 10/2012 | Yoon et al. | 438/272 |
| 8,368,137 B2 * | 2/2013 | Mokhlesi et al. | 257/315 |
| 8,372,715 B2 * | 2/2013 | Chung et al. | 438/270 |
| 2006/0097304 A1 * | 5/2006 | Yoon et al. | 257/307 |
| 2006/0158931 A1 * | 7/2006 | Khouri et al. | 365/185.01 |
| 2006/0284225 A1 * | 12/2006 | Popp et al. | 257/296 |
| 2007/0012996 A1 * | 1/2007 | Yoon et al. | 257/329 |
| 2007/0075359 A1 * | 4/2007 | Yoon et al. | 257/329 |
| 2007/0134884 A1 * | 6/2007 | Kim et al. | 438/424 |
| 2007/0295995 A1 * | 12/2007 | Yun et al. | 257/202 |
| 2008/0105862 A1 * | 5/2008 | Lung et al. | 257/4 |
| 2008/0160680 A1 * | 7/2008 | Yuan | 438/129 |
| 2009/0004843 A1 * | 1/2009 | Mokhlesi et al. | 438/622 |
| 2009/0148991 A1 * | 6/2009 | Chung et al. | 438/268 |
| 2010/0140695 A1 * | 6/2010 | Yedinak et al. | 257/334 |
| 2010/0163846 A1 * | 7/2010 | Yilmaz et al. | 257/24 |
| 2010/0181613 A1 * | 7/2010 | Kim et al. | 257/329 |
| 2010/0219466 A1 * | 9/2010 | Sung et al. | 257/329 |
| 2011/0018059 A1 * | 1/2011 | Dunn et al. | 257/334 |
| 2011/0101447 A1 * | 5/2011 | Cho | 257/329 |
| 2011/0143508 A1 * | 6/2011 | Kim et al. | 438/270 |
| 2011/0220977 A1 * | 9/2011 | Yoon et al. | 257/296 |
| 2011/0291186 A1 * | 12/2011 | Yilmaz et al. | 257/334 |
| 2011/0303967 A1 * | 12/2011 | Harari et al. | 257/321 |
| 2011/0309426 A1 * | 12/2011 | Purayath et al. | 257/316 |
| 2012/0025300 A1 * | 2/2012 | Chung et al. | 257/330 |
| 2012/0193748 A1 * | 8/2012 | Yedinak et al. | 257/488 |
| 2012/0273919 A1 * | 11/2012 | Im | 257/522 |

* cited by examiner

INTEGRATED CIRCUIT DEVICES INCLUDING VERTICAL CHANNEL TRANSISTORS WITH SHIELD LINES INTERPOSED BETWEEN BIT LINES AND METHODS OF FABRICATING THE SAME

CROSS-REFERENCE TO RELATED APPLICATIONS

This application claims priority from Korean Patent Application No. 10-2010-0056190, filed on Jun. 14, 2010, in the Korean Intellectual Property Office, the disclosure of which is incorporated by reference herein in its entirety.

BACKGROUND

The inventive concept relates to integrated circuit devices, and more particularly, to integrated circuit devices including vertical channel transistors and methods of fabricating the same.

As the degree of integration of integrated circuit devices increases, design rules with respect to components of the integrated circuit devices may be significantly decreased. In particular, as more and more transistors are included in semiconductor devices, the gate length of each transistor may be reduced, and likewise, the channel length may be reduced. Vertical channel transistors have been introduced in order to increase an effective channel length by increasing a distance between source and drain regions in highly-integrated semiconductor devices.

SUMMARY

The inventive concept provides a semiconductor device that includes buried bit lines and a vertical channel transistor for realizing high-integration, and reduces a capacitance between the buried bit lines.

The inventive concept further provides a method of manufacturing a semiconductor device that includes buried bit lines and a vertical channel transistor, and reduces a capacitance between the buried bit lines.

According to some embodiments of the inventive concept, an integrated circuit device, includes a plurality of pillars protruding from a substrate in a first direction, each of the pillars including source/drain regions in opposite ends thereof and a channel region extending between the source/drain regions; a plurality of conductive bit lines on the substrate adjacent the pillars and extending in a second direction substantially perpendicular to the first direction; and a plurality of conductive shield lines on the substrate and extending in the second direction, each of the shield lines extending between adjacent ones of the bit lines.

In some embodiments, each of the bit lines may electrically contact a respective one of the source/drain regions of a respective one of the pillars adjacent thereto, and each of the shield lines may be electrically insulated from the respective one of the source/drain regions.

In some embodiments, respective shield insulating layers may be provided between sidewalls of the shield lines and sidewalls of ones of the bit lines adjacent thereto. Each of the shield lines may be electrically insulated from the ones of the bit lines adjacent thereto by the respective shield insulating layers.

In some embodiments, respective air gaps may be provided between sidewalls of the shield lines and sidewalls of ones of the bit lines adjacent thereto, and each of the shield lines may be electrically insulated from the ones of the bit lines adjacent thereto by the respective air gaps.

In some embodiments, the shield lines may not provide electrical interconnections for the device.

In some embodiments, each of the bit lines may extend on the substrate in the second direction adjacent a base of the respective one of the pillars adjacent thereto.

In some embodiments, a plurality of conductive word lines may extend in a third direction substantially perpendicular to the first and second directions, and each of the word lines may extend on ones of the pillars between the source/drain regions thereof.

In some embodiments, the word lines may be spaced apart from each other along the second direction, and the bit lines may be spaced apart from each other along the third direction.

In some embodiments, the shield lines may be directly on the substrate.

In some embodiments, the substrate may be silicon, and the shield lines may be epitaxial layers of doped silicon.

In some embodiments, each of the shield lines may be provided in a respective trench in the substrate that extends between sidewalls of the adjacent ones of the bit lines.

In some embodiments, a junction oxide layer may be provided between the plurality of pillars and the substrate. The junction oxide layer may include the plurality of bit lines thereon. Each of the shield lines may be provided in a respective trench in the junction oxide layer between sidewalls of the adjacent ones of the bit lines.

In some embodiments, the shield lines may extend towards the substrate in the first direction beyond the bit lines.

In some embodiments, the shield lines may further extend away from the substrate in the first direction to a substantially similar level as the bit lines.

In some embodiments, the shield lines may further extend away from the substrate in the first direction beyond the bit lines.

In some embodiments, the shield lines may be first and second shield lines, where each of the first shield lines may include shield insulating layers directly on sidewalls of the adjacent ones of the bit lines, and each of the second shield lines may be separated from the sidewalls of the adjacent ones of the bit lines by portions of the pillars.

In some embodiments, the first and second shield lines may be formed of a same material.

In some embodiments, the shield lines and the bit lines may be formed of a same material.

According to further embodiments of the inventive concept, a method of fabricating an integrated circuit device includes forming a plurality of pillars protruding from a substrate in a first direction, each of the pillars including a source/drain region in an end thereof adjacent the substrate; forming a plurality of conductive bit lines on the substrate adjacent the pillars and extending in a second direction substantially perpendicular to the first direction; and forming a plurality of conductive shield lines on the substrate and extending in the second direction, each of the shield lines extending between adjacent ones of the bit lines.

In some embodiments, each of the bit lines may electrically contact a respective source/drain region of a respective one of the pillars adjacent thereto, and each of the shield lines may be electrically insulated from the respective source/drain region.

In some embodiments, forming the plurality of shield lines may include forming trenches extending between the adjacent ones of the bit lines towards the substrate; forming respective shield insulating layers on sidewalls of the trenches; and then forming the shield lines in the trenches such that each of the shield lines is in a respective one of the trenches and is electrically insulated from ones of the bit lines adjacent thereto by the respective shield insulating layers.

In some embodiments, the method may further include substantially removing the respective shield insulating layers from the sidewalls of the trenches to define respective air gaps between sidewalls of the shield lines and sidewalls of ones of the bit lines adjacent thereto such that each of the shield lines is electrically insulated from the ones of the bit lines adjacent thereto by the respective air gaps.

In some embodiments, the shield lines may not provide electrical interconnections for the device.

In some embodiments, the trenches may expose the substrate, and the shield lines may be formed in the trenches directly on the substrate.

In some embodiments, the substrate may be silicon, and forming the shield lines directly on the substrate may include epitaxially growing silicon layers doped with impurities on the substrate in the trenches to define the plurality of shield lines.

In some embodiments, forming the shield lines directly on the substrate may include forming a conductive layer in the trenches; and etching-back the conductive layer in the trenches to define the shield lines therein.

In some embodiments, the trenches may be formed extending into respective active regions of the substrate between sidewalls of the adjacent ones of the bit lines, where each of the respective active regions may include the source/drain region of a respective one of the pillars protruding therefrom.

In some embodiments, the trenches maybe first trenches, the shield lines may be first shield lines, and the respective shield insulating layers may be first shield insulating layers formed directly on sidewalls of the adjacent ones of the bit lines. The method may further include forming second trenches extending into the respective active regions of the substrate between adjacent ones of the first shield lines; forming respective second shield insulating layers on sidewalls of the second trenches; and then forming second shield lines in the second trenches such that each of the second shield lines is in a respective one of the second trenches and is separated from the sidewalls of the adjacent ones of the bit lines by a portion of the pillars.

In some embodiments, the method may further include forming a junction oxide layer on the substrate, where the plurality of bit lines may be formed on the junction oxide layer, and where the trenches may be formed in the junction oxide layer between the adjacent ones of the bit lines.

According to an aspect of the inventive concept, there is provided a semiconductor device including a plurality of active pillars that are spaced apart from each other on a substrate in an X-axis direction and a Y-axis direction, and are insulated from each other; a plurality of buried bit lines that are formed in a lower level than upper surfaces of the active pillars, are spaced apart from each other in the X-axis direction, and extend in the Y-axis direction orthogonal to the X-axis direction; and a plurality of shield lines that are spaced apart from each other in the X-axis direction, and extend in the Y-axis direction with shield insulating layers interposed between the buried bit lines.

The semiconductor device may further include word lines that are spaced apart from each other in the Y-axis direction, and extend in the X-axis direction while crossing spaces between the active pillars. The shield lines may be located in a lower level than the word lines. First source and drain regions may be formed below the active pillars with respect to the word lines, and second source and drain regions are formed above the active pillars with respect to the word lines.

The shield lines may be formed so as to contact the substrate. The buried bit lines may be formed in a first trench formed by etching the substrate, and may be formed on first sides of the active pillars. A second trench has a greater depth than the first trench in the first sides of the buried bit lines, and the shield lines may be interposed between the second trench and the shield lines.

The buried bit lines may be formed so as to contact lower surfaces of the active pillars. The semiconductor device may further include junction oxide layer including trenches through which the substrate is exposed, wherein the junction oxide layer patterns may be formed on the substrate disposed below the buried bit lines. A shield insulating layer may be formed on lateral surfaces of the buried bit lines disposed above the junction oxide layer patterns, and the shield lines may be formed between the buried bit lines with the shield insulating layer between the buried bit lines and the shield lines. Air layers may be formed on the lateral surfaces of the buried bit lines disposed above the junction oxide layer, and the shield lines may be formed between the buried bit lines with the air layers interposed between the buried bit lines and the shield lines.

According to another aspect of the inventive concept, there is provided a semiconductor device including a plurality of unit structures that are insulated from each other in an X-axis direction in a substrate by first shield lines between which first shield layers are interposed, and are insulated from each other by insulating layer in a Y-axis direction orthogonal to the X-axis direction, wherein each unit structure includes a first active pillar and a second active pillar that are spaced apart from each other on the substrate in the X-axis direction; a first active region that is located below the first active pillar, and has a greater width than the first active pillar in the X-axis direction; a second active region that is located below the second active pillar, has a greater width than the second pillar active pillar, and is formed to be symmetrical with respect to the first active region in a −X-axis direction; buried bit lines formed on first sides of the first active pillar and the second active pillar; and a second shield line that is located between the first active pillar and the second active pillar, and is formed in a lower level than lower surfaces of the buried bit lines with a second shield insulating layer interposed between the buried bit lines and the second shield line.

The buried bit lines may extend in the Y-axis direction in first trenches formed by etching the substrate. The first shield line and the second shield line may extend in the Y-axis direction in second trenches formed by etching the substrate.

According to another aspect of the inventive concept, there is provided a method of manufacturing a semiconductor device including forming a plurality of active pillars that are spaced apart from each other on a substrate in an X-axis direction and a Y-axis direction, and are insulated from each other. A plurality of buried bit lines that are formed in a lower level than upper surfaces of the active pillars, are spaced apart from each other in the X-axis direction, and extend in the Y-axis direction orthogonal to the X-axis direction are formed. A plurality of shield lines that are spaced apart from each other in the X-axis direction, and extend in the Y-axis direction with shield insulating layers interposed between the buried bit lines are formed.

The shield lines may be formed so as to contact the substrate. The buried bit lines may be formed in a first trench formed by etching the substrate, and are formed on first sides of the active pillars. A second trench may have a greater depth than the first trench in the first sides of the buried bit lines, and the shield lines may be interposed between the second trench and the shield lines.

The buried bit lines may be formed so as to contact lower surfaces of the active pillars. The method may further include: forming junction oxide layer patterns including trenches through which the substrate is exposed, wherein the junction oxide layer patterns are formed on the substrate disposed below the buried bit lines. The method may further include: after forming the shield lines, forming air layers on lateral surfaces of the buried bit lines disposed above the junction oxide layer patterns by removing the shield insulating layer.

According to another aspect of the inventive concept, there is provided a method of manufacturing a semiconductor device including patterning a substrate to form pre-active pillars, and first trenches between the pre-active pillars. First source and drain regions are formed in lower portions of the pre-active pillars, which contact lower surfaces of the first trenches. The substrate is etched to a greater depth than the first trenches to form second trenches, and to extend lower portions of the second trenches.

Buried bit lines are formed on lower side portions of the pre-active pillars, and third trenches are formed to a greater depth than the second trenches between the buried bit lines. First shield insulating layers are formed on lateral surfaces of the second trenches and the buried bit lines. First shield lines are formed with the first shield insulating layers interposed between the buried bit lines in the third trenches. Second source and drain regions are formed in upper portions of the pre-active pillars.

The pre-active pillars are patterned to form a plurality of active pillars, and fourth trenches between the active pillars. Second shield insulating layers are formed on lateral surfaces of the fourth trenches and the buried bit lines. Second shield lines are formed with the second shield insulating layers interposed between the buried bit lines in the fourth trenches.

The etching of the substrate may include forming first spacers on lateral surfaces of the pre-active pillars; further etching the substrate by aligning the first spacers as an etch mask to form the second trenches; and etching lateral surfaces of the second trenches below the first spacers.

The buried bit lines and the third trenches may be formed by forming a conductive layer on lower surfaces of the second trenches; forming second spacers on the first spacers formed on the lateral surfaces of the pre-active pillars and the conductive layer; and etching the conductive layer and the substrate so as to be aligned with the second spacers.

The method may further include: after forming the first shield lines, forming insulating layers so as to fill and cover the third trenches on the first shield lines; and planarizing a surface of the substrate including the insulating layer to form a buried insulating layer in the third trenches.

The method may further include, after forming the third trenches, forming an insulating layer so as to fill and cover the third trenches; planarizing the surface of the substrate including the insulating layer; removing the insulating layer, the first spacers, and the second spacers in the third trenches; and forming third spaces and fourth spacers on lateral surfaces of the pre-active pillars on the buried bit lines. The first shield line and the second shield lines may be formed by filling and covering the third trenches and the fourth trenches with a conductive layer, and then etching-back the conductive layer. The first shield lines and the second shield lines may be formed by epitaxially growing a silicon layer that is doped with impurities in the third trenches and the fourth trenches.

According to another aspect of the inventive concept, there is provided a method of manufacturing a semiconductor device including adhering a second substrate on which a conductive layer is formed onto a first substrate by using a junction oxide layer as a medium. The second substrate and the conductive layer may be formed to form buried bit lines, active pillars, and first trenches between the active pillars, which are sequentially stacked on the junction oxide layer. Shield insulating layers are formed on lateral surfaces of the buried bit lines, the active pillars, and the junction oxide layer.

The junction oxide layer located below the buried bit lines are etched to form second trenches through which the first substrate is exposed between the buried bit lines and the active pillars. Shield lines are formed with shield insulating layers interposed between the buried bit lines in the second trenches.

The buried bit lines, the active pillar, and the first trenches may be formed by forming a mask pattern on the second substrate, and then etching the second substrate and the conductive layer as an etch mask. The second trenches and a junction oxide layer pattern may be formed by etching the junction oxide layer by using the mask pattern as an etch mask.

The shield lines may be formed by filling and covering the second trenches with a conductive layer, and etching the conductive layer. The shield lines may be formed by epitaxially growing a silicon layer that is doped with impurities in the second trenches. The method may further include: after forming the shield lines, forming air layers by removing shield layers between the buried bit lines.

BRIEF DESCRIPTION OF THE DRAWINGS

Exemplary embodiments of the inventive concept will be more clearly understood from the following detailed description taken in conjunction with the accompanying drawings in which:

FIG. 38 is a plan view of a memory module including a semiconductor device according to an embodiment of the inventive concept;

DETAILED DESCRIPTION

Figure 1:
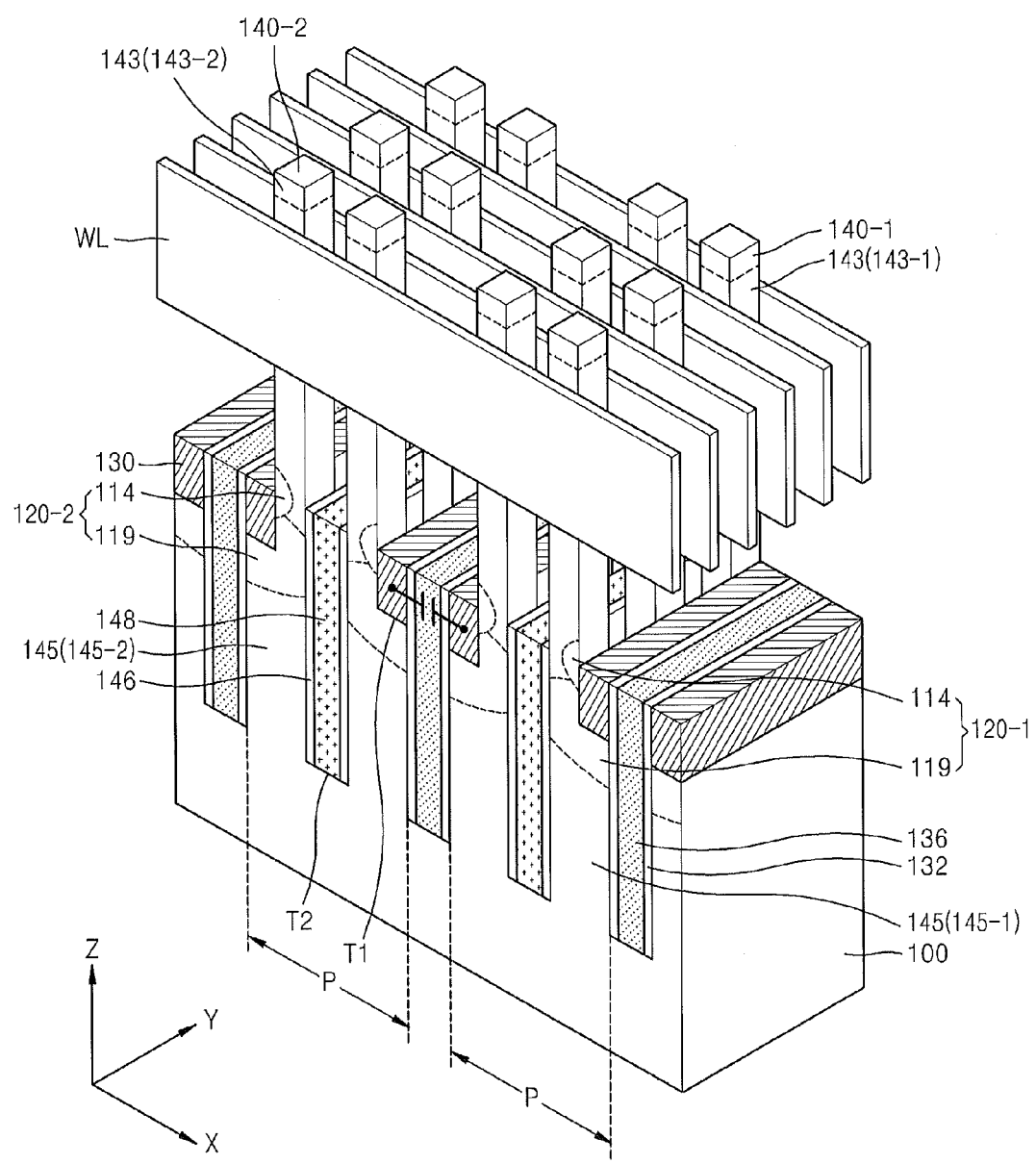
FIG. 1 is a perspective view for explaining a three-dimensional (3D) arrangement of main components of a semiconductor device according to an embodiment of the inventive concept.

The inventive concept will now be described more fully with reference to the accompanying drawings, in which exemplary embodiments of the inventive concept are shown.

The inventive concept may, however, be embodied in many different forms and should not be construed as being limited to the embodiments set forth herein; rather, these embodiments are provided so that this disclosure will be thorough and complete, and will fully convey the concept of the inventive concept to those of ordinary skill in the art. In the drawings, the thicknesses of layers and regions are exaggerated for clarity. Like numerals refer to like elements throughout.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. In addition, throughout this specification, first through nth elements (where n is a positive integer.) are used to explain embodiments of the present embodiment, rather than being used in order.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to," "directly coupled to," or "in direct contact with" another element or layer, there are no intervening elements or layers present. Other expressions for describing relationships between elements, for example, "between" and "immediately between" or "neighboring" and "directly neighboring" may also be understood likewise.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
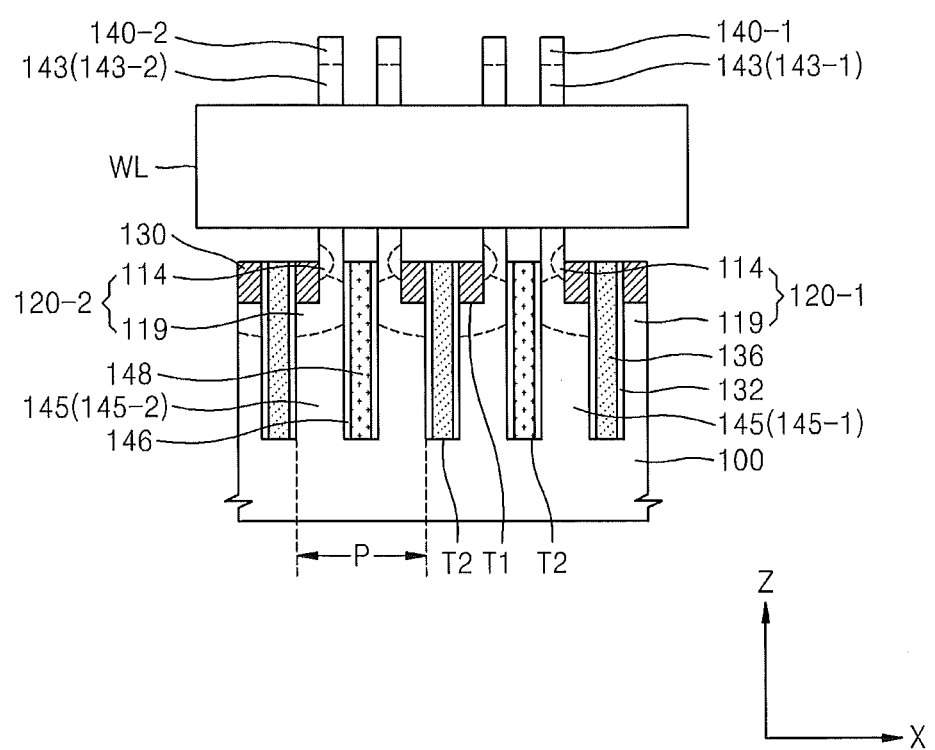
FIG. 2 is a cross-sectional view of the semiconductor device taken along a direction of word lines of FIG. 1.

FIG. 1 is a perspective view for explaining a three-dimensional (3D) arrangement of components of a semiconductor device according to an embodiment of the inventive concept. FIG. 2 is a cross-sectional view of the semiconductor device taken along a direction of word lines WL of FIG. 1.

Referring to FIGS. 1 and 2, the semiconductor device according to the present embodiment includes first and second active pillars 143-1 and 143-2 that are spaced apart from each other and insulated from each other in an X-axis direction and a Y-axis direction that is orthogonal to the X-axis direction. Hereinafter, the first and second active pillars 143-1 and 143-2 will be collectively denoted by reference number 143. The X-axis direction and the Y-axis direction are based on a plane on which a substrate 100 is disposed. A Z-axis direction is orthogonal to the plane of the substrate 100, and is orthogonal to the X-axis direction and the Y-axis direction. The first and second active pillars 143 may be defined by forming first trenches T1 in a downward direction from an upper surface of the substrate 100 to a predetermined depth. Lower portions of the first and second active pillars 143 are connected to first and second active regions 145-1 and 145-2. Hereinafter, the first and second active regions 145-1 and 145-2 will be collectively denoted by reference number 145.

First source and drain regions 120-1 and 120-2 are formed in the first and second active regions 145 formed below the first and second active pillars 143, and second source and drain regions 140-1 and 140-2 are formed in upper portions of the first and second active pillars 143. The word lines WL are formed between portions of adjacent active pillars, which are located between the first source and drain regions 120-1 and 120-2, and the second source and drain regions 140-1 and 140-2 with the gate insulating layers (not shown) interposed between the first and second active pillars 143 and the word lines WL.

With respect to the word lines WL, the first source and drain regions 120-1 and 120-2 are formed in lower portions of the first and second active pillars 143, and the second source and drain regions 140-1 and 140-2 are formed in upper portions of the first and second active pillars 143. The word lines WL are spaced apart from each other in the Y-axis direction, and extend in the X-axis direction while crossing spaces between the first and second active pillars 143.

Thus, vertical channel transistors including channel regions perpendicular to the first and second active pillars 143 are provided. In particular, first and second vertical channel transistors include the first source and drain regions 120-1 and 120-2, the second source and drain regions 140-1 and 140-2, the first and second active pillars 143, the first and second active regions 145, and the word lines WL, respectively.

Buried bit lines 130 are formed in a lower level than upper surfaces of the first and second active pillars 143, and are formed in the first trenches T1. The buried bit lines 130 extend in the Y-axis direction, and are spaced apart from each other in the X-axis direction. Second trenches T2 having a greater depth than that of the first trenches T1 are formed between the buried bit lines 130, and first and second shield lines 136 and 148 are formed in the second trenches T2 in the Y-axis direction with first and second shield insulating layers 132 and 146 interposed between the first and second shield lines 136 and 148 and surfaces of the second trenches T2, respectively.

The first and second shield lines 136 and 148 are spaced apart from each other in the X-axis direction, and extend in the Y-axis direction. The first and second shield lines 136 and 148 are formed in a lower level than the word lines WL. The first and second shield lines 136 and 148 may each be a conductive line. The first and second shield lines 136 and 148 are formed so as to contact the substrate 100. The first and second shield lines 136 and 148 reduce a capacitance between adjacent ones of the buried bit lines 130 so as to increase an operating speed and/or otherwise improve the operating characteristics of the semiconductor devices according to some embodiments. In contrast, if only an insulating layer is provided between the buried bit lines 130 without any shield lines therebetween, a capacitance between the buried bit lines 130 may be increased, which may adversely affecting the operation speed and the operation characteristic of the semiconductor device. In some embodiments, the first shield lines 136 and/or the second shield lines 148 may provide no electrical interconnections for the device.

Hereinafter, a unit structure P of the semiconductor device according to the present embodiment will be described in detail, with reference to FIGS. 1 and 2. The unit structure P of the semiconductor device according to the present embodiment is repeatedly formed in the X-axis direction and the Y-axis direction, and the semiconductor device includes a plurality of unit structures P. The unit structures P are insulated from each other in the X-axis direction by the first shield line 136 formed in each second trench T2 of the substrate 100 with the first shield insulating layer 132 interposed between surfaces of the second trench T2 and the first shield line 136, and are insulated from each other in the Y-axis direction by an insulating layer (not shown). The word lines WL are formed on front and rear surfaces of the unit structure P in the Y-axis direction.

The unit structure P includes the first and second active pillars 143-1 and 143-2 that are spaced apart from each other in the X-axis direction. The first active pillars 143-1 are respectively connected to the first active regions 145-1 formed therebelow. The first active regions 145-1 are formed so as to have a greater width than that of the first active pillars 143-1 in the X-axis direction. The buried bit lines 130 are formed in the first trenches T1 that are formed in first sides of the first active regions 145-1 in the X-axis direction.

The second active pillars 143-2 are connected to the second active regions 145-2 formed therebelow. The second active regions 145-2 are formed to be symmetric with respect to the first active regions 145-1 in a –X-axis direction, and are formed so as to have greater widths than those of the second active pillars 143-2. The buried bit lines 130 are formed in the first trenches T1 that are formed in second sides of the first active regions 145-1 in the –X-axis direction.

In the unit structures P, the second shield lines 148 are formed in the second trenches T2 between the first active pillars 143-1 and the second active pillars 143-2 with the second shield insulating layers 146 interposed between surfaces of the second trenches T2 and the first and second active pillars 143. In addition, the unit structures P are insulated by insulating the first shield insulating layers 132 between the unit structures P in the X-axis direction, and the second shield layers 146 extend in the Y-axis direction.

First and second semiconductor devices having the above-described structure include the first source and drain regions 120-1 and 120-2, and the second source and drain regions 140-1 and 140-2, respectively. The second source and drain regions 140-1 and 140-2 are formed above and the first source and drain regions 120-1 and 120-2 are formed below the active pillars 143 in the Z-axis direction with respect to the word lines WL. Thus, first and second vertical channel transistors including channel regions perpendicular to the first and second active pillars 143 are obtained. In order to reduce the capacitance between the buried bit lines 130, the shield lines 136 and 148 are disposed between adjacent ones of the buried bit lines 130. Thus, in the semiconductor devices according to the present embodiment, a capacitance between the buried bit lines 130 may be reduced, and thus the operation speeds of the semiconductor devices may be increased, and the operational characteristics of the semiconductor devices may be improved.

A lower electrode (not shown) of a capacitor may be formed on the second source and drain regions 140-1 and 140-2 on the first and second active pillars 143. In this case, the semiconductor device according to the present embodiment may be a dynamic random access memory (DRAM) semiconductor device, but the inventive concept is not limited thereto. The inventive concept may be applied to any semiconductor device as long as the shield lines 136 and 148 are disposed between the buried bit lines 130.

Figure 3:
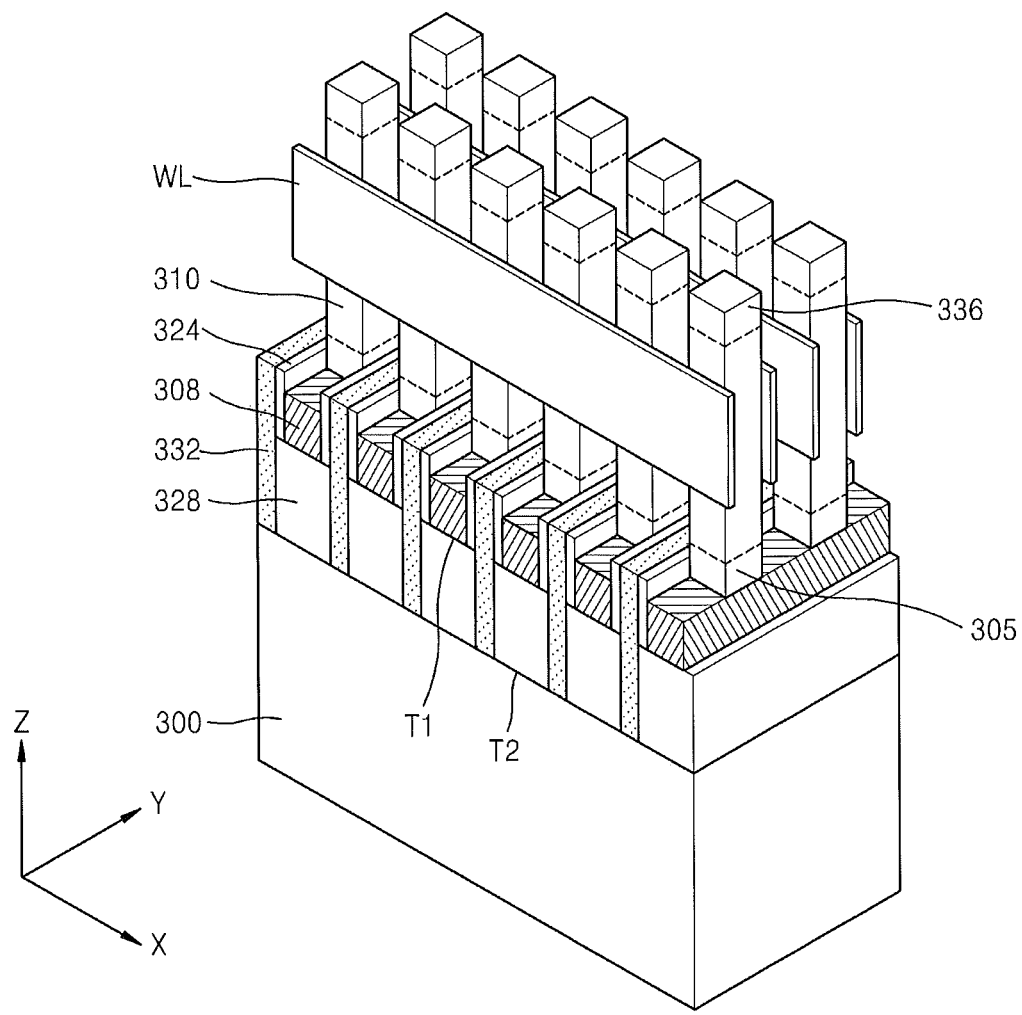
FIG. 3 is a perspective view for explaining a 3D arrangement of main components of a semiconductor device according to another embodiment of the inventive concept.
Figure 4:
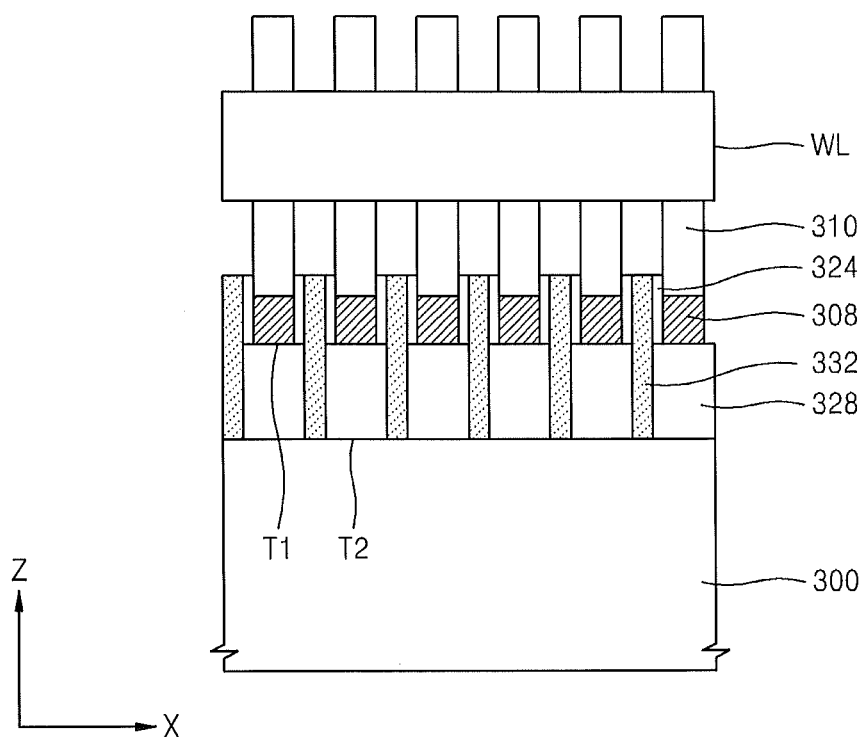
FIG. 4 is a cross-sectional view of the semiconductor device taken along a direction of word lines of FIG. 3.

FIG. 3 is a perspective view for explaining a 3D arrangement of main components of a semiconductor device according to another embodiment of the inventive concept. FIG. 4 is a cross-sectional view of the semiconductor device taken along a direction of word lines WL of FIG. 3.

Referring to FIGS. 3 and 4, the semiconductor device according to the present embodiment includes active pillars 310 that are spaced apart from each other and insulated from each other in an X-axis direction and a Y-axis direction that is orthogonal to the X-axis direction. Hereinafter, the X-axis direction and the Y-axis direction are based on a plane on which a substrate 300 is disposed. A Z-axis direction is orthogonal to the plane of the substrate 300, and is orthogonal to the X-axis direction and the Y-axis direction.

The active pillars 310 may be defined by etching from an upper surface of a second substrate constituting a junction substrate to a lower surface, which will be described later. Buried bit lines 308 are defined below the active pillars 310 by forming first trenches T1 from the upper surface of the second substrate constituting the junction substrate to the lower surface. The bit lines 308 are spaced apart from each other in the X-axis direction, and extend in the Y-axis direction.

First source and drain regions 305 are formed below the active pillars 310, and second source and drain regions 336 are formed above the active pillars 310. The word lines WL extend in the X-axis direction between portions of adjacent active pillars, which are located between the first source and drain regions 305, and the second source and drain regions 336 with gate insulating layers (not shown) interposed between the active pillars 310 and the word lines WL, and are spaced apart from each other in the Y-axis direction. The semiconductor device according to the inventive concept includes the first source and drain region 305, the second source and drain region 336, the active pillar 310, and the word line WL, and thus a vertical channel transistor including channel regions that are formed in the Z-axis direction is obtained.

The buried bit lines 308 and junction oxide layer patterns 328 are formed in a lower level than upper surfaces of the active pillars 310 so as to contact lower portions of the active pillars 310. The junction oxide layer patterns 328 formed below the buried bit lines 308 are spaced apart from each other in the X-axis direction, and extend in the Y-axis direction.

Second trenches T2 having a greater depth than that of the first trenches T1 are formed between the buried bit lines 308. The second trenches T2 expose portions of the substrate 300 between the buried bit lines 308, and are formed in the junction oxide layer patterns 328. That is, the junction oxide layer patterns 328 include the second trenches T2 that expose the portions of the substrate 300 therethrough. Shield lines 332 are formed in the second trenches T2 in the Y-axis direction with shield insulating layers 324 interposed between surfaces of the second trenches T2 and the shield lines 332.

The shield lines 332 are located in a lower level than the word lines WL. The shield lines 332 are each a conductive line. The shield lines 332 are formed so as to contact the substrate 300. The shield lines 332 reduce a capacitance between the buried bit lines 308 so as to increase an operation of the semiconductor device, and to improve the operation characteristic of the semiconductor device. If only an insulating layer is buried between the buried bit lines 308 without any shield line, a capacitance between the buried bit lines 308 is increased, thereby adversely affecting the operation speed and the operation characteristics of the semiconductor device.

FIGS. 5 through 21 are cross-sectional views for explaining a method of manufacturing a semiconductor device, according to an embodiment of the inventive concept. FIGS. 5 through 21 illustrate a method of manufacturing the semiconductor device described with reference to FIGS. 1 and 2. FIGS. 5 through 21 illustrate the method of manufacturing the semiconductor device by using a bulk substrate (bulk wafer).

Figure 5:
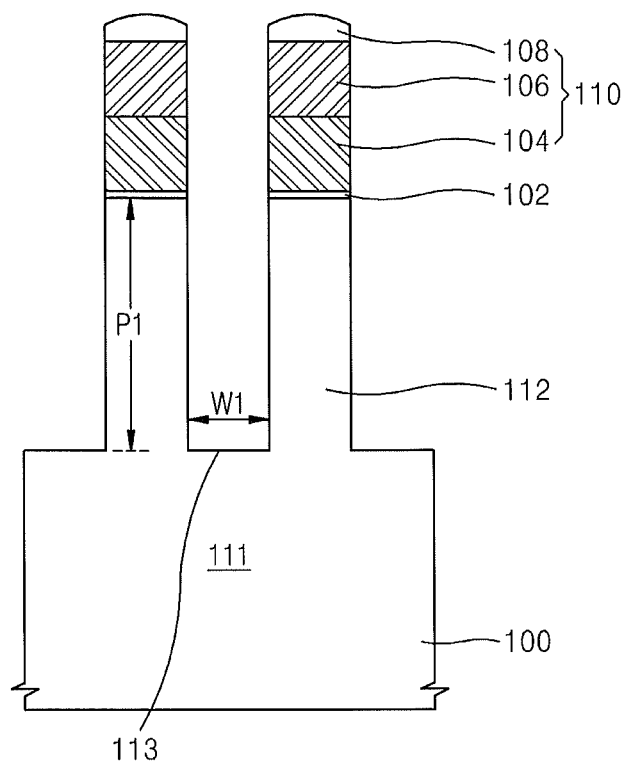
FIGS. 5 through 21 are cross-sectional views for explaining a method of manufacturing a semiconductor device, according to an embodiment of the inventive concept.

Referring to FIG. 5, a pad oxide layer, and a multi-layered mask layer are sequentially formed on the substrate 100, and are patterned to form stack structures including pad oxide patterns 102, and multi-layered mask patterns 110. The pad oxide patterns 102, and multi-layered mask patterns 110 constitute the stack structures. Portions of an upper surface of the substrate 100 are exposed through the multi-layered mask patterns 110. The substrate 100 may be a silicon substrate (a silicon wafer). In addition, each multi-layered mask pattern 110 may include a polysilicon layer 104, a silicon nitride layer 106, and a silicon oxide layer 108.

In some embodiments, after the pad oxide layer is formed on the substrate 100, before the multi-layered mask layer is formed, an ion injection operation may be performed in order to form wells in the substrate 100. In addition, after the pad oxide layer is formed on the substrate 100, before the multi-layered mask patterns 110 are formed, a bulk ion injection operation may be performed in order to form a channel region in the substrate 100.

The exposed portions of the substrate 100 are etched by using the multi-layered mask patterns 110 as a mask so as to form first trenches 113 having a width W1, and a first depth P1 that is measured to a lower surface of each first trench 113 from an upper surface of the substrate 100, and to form a pre-active pillars 112, and an active region 111. The first trenches 113 are formed between the pre-active pillars 112, and each of the pre-active pillars 112 has a height of P1. Upper surfaces of the pre-active pillars 112 may have patterns of a plurality of islands, like the multi-layered mask patterns 110. The pre-active pillars 112 are divided into two pre-active pillars 112 that are located on sides of the substrate 100 with respect to the first trenches 113.

Figure 6:
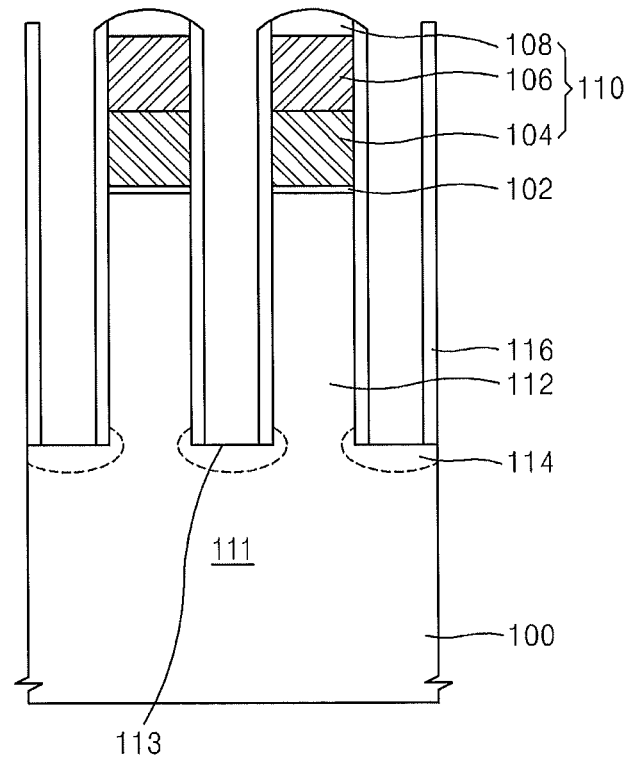

Referring to FIG. 6, silicon oxide layers (not shown) are formed on lateral or sidewall surfaces of each pre-active pillar 112, each pad oxide pattern 102, and each multi-layered mask pattern 110 by using an oxidizing operation. Thus, surface defects, of the substrate 100, which may be caused during an etching operation for forming the first trenches 113, may be compensated for. The silicon oxide layer may be omitted in some embodiments.

Then, a low-concentration impurity ion injection operation for forming first source and drain regions is performed on portions of the active region 111 of the substrate 100, which are located around lower surfaces of the trenches 113, by using the multi-layered mask patterns 110 as an ion injection mask, to form first impurity regions 114. For example, the low-concentration impurity may include N-type impurity ions. However, the inventive concept is not limited thereto.

Then, first spacers 116 are formed on lateral or sidewall surfaces of each pre-active pillar 112, each pad oxide layer pattern 102, and each multi-layered mask pattern 110. The first spacers 116 may be formed by using a silicon nitride layer. The first spacers 116 may be formed on internal surfaces of the first trenches 113.

A silicon nitride layer is formed on a front surface of the substrate 100 on which a silicon oxide layer is formed, and then portions of the silicon nitride layer remain only on the internal surfaces of the first trenches 113 by etching-back the silicon nitride layer, to form the first spacers 116. Due to over-etching during the etch-back operation for forming the first spacers 116, the active region 111 of the substrate 100 may be exposed through the lower surfaces of the first trenches 113.

Figure 7:
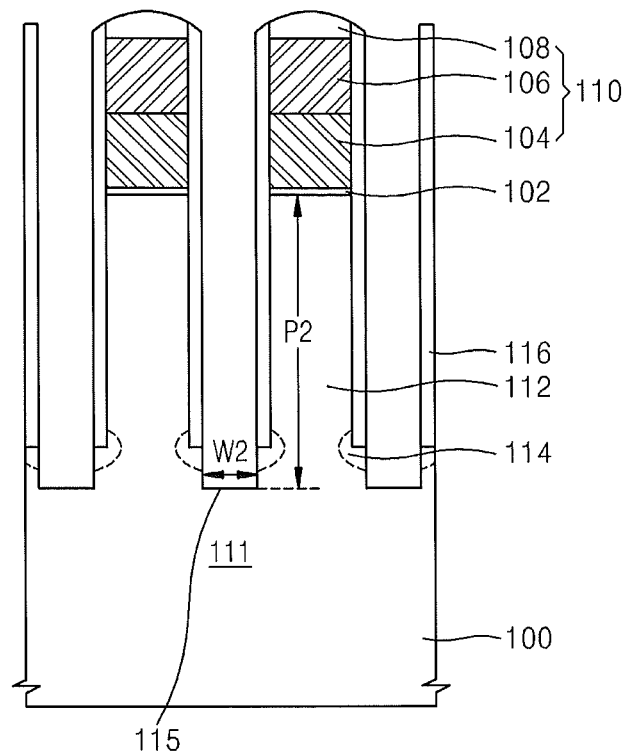
Figure 8:
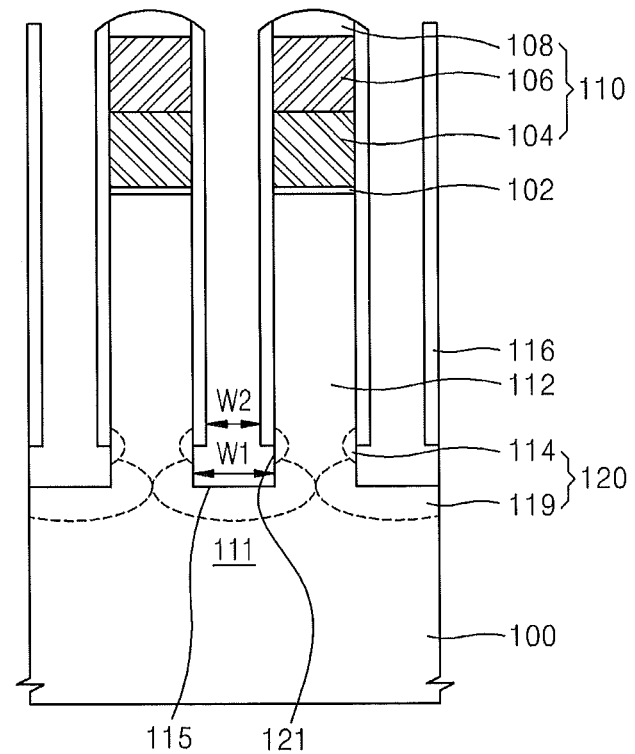

Referring to FIGS. 7 and 8, portions of the active region 111, which are located below the first trenches 113, are further etched by using the multi-layered mask patterns 110 and the first spacers 116 as an etch mask, to form second trenches 115 having an upper width W2, and a second depth P2 that is measured to a lower surface of each second trench 115 from the upper surface of the substrate 100.

Then, as illustrated in FIG. 8, a high-concentration ion injection operation for forming the first source and drain regions is performed on the portions of the active region 111, which are exposed through the lower surfaces of the second trenches 115, by using the multi-layered mask patterns 110 and the first spacers 116 as an ion injection mask, to form second impurity regions 119. The high-concentration impurity may include the same ion as the low-concentration impurity, for example, N-type impurity ions.

As a result, first source/drain regions 120 including the first impurity regions 114 and the second impurity regions 114 are formed in the substrate 100 around portions of the active region 111, which are located below the second trench 115.

Then, as illustrated in FIG. 8, portions of the active region 111, which are located below the first spacers 116, are etched. That is, the portions of the active region 111 of the substrate 100 are etched from the lower surfaces and lateral or sidewall surfaces of the second trenches 115 towards the active region 111 to form recess regions 121. By etching the substrate 100, bottom portions of the second trenches 115 extend. Thus, a lower width W1 of the second trenches 115 is greater than the upper width W2. The lower width W1 of the second trenches may be the same as the width of the first trench 113.

Figure 9:
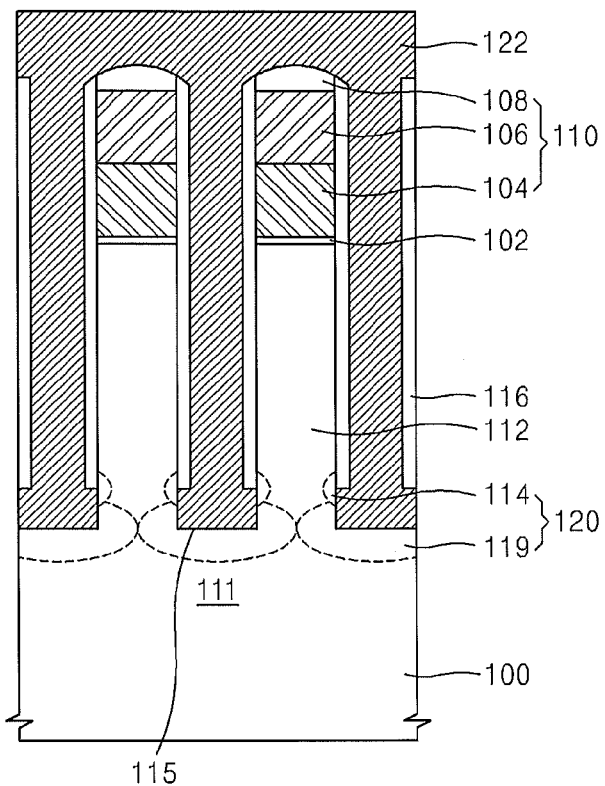
Figure 10:
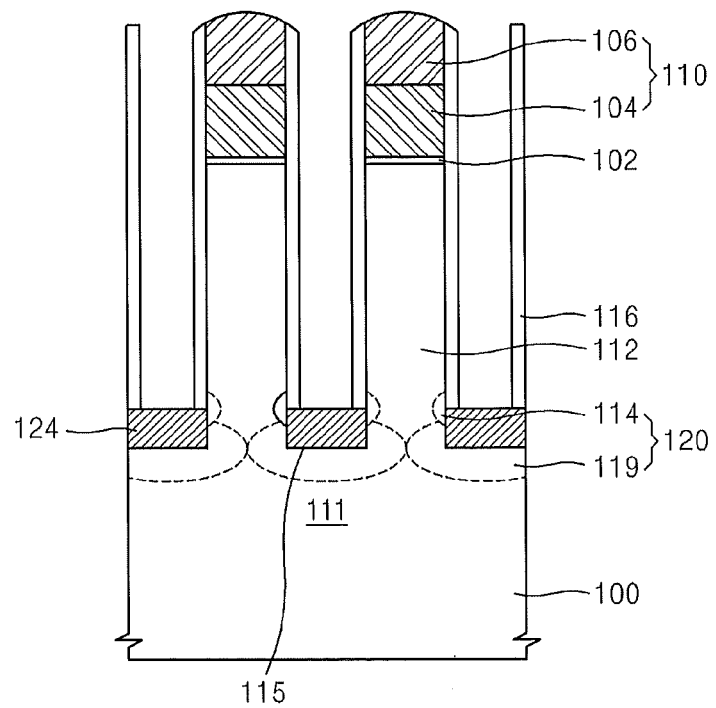

Referring to FIGS. 9 and 10, a conductive material is deposited on a resulting structure where first source and drain regions 120, and the first spacers 116 are formed, to form a first conductive layer 122 that fills and covers the second trenches 115. The first conductive layer 122 is a material layer that is to be formed as buried bit lines later. The first conductive layer 122 may be formed of metal such as tungsten (W), aluminum (Al), copper (Cu), molybdenum (Mo), titanium (Ti), tantalum (Ta), or ruthenium (Ru). In addition, the first conductive layer 122 may be formed of a metal nitride such as TiN, TiN/W, Ti/TiN, WN, W/WN, TaN, Ta/TaN, TiSiN, TaSiN, or WSiN.

Then, as illustrated in FIG. 10, portions of the first conductive layer 122 is etched-back and removed so that the first conductive layer 122 may remain only on the lower surfaces of the second trenches 115, to form first buried layers 124 that remain on the lower surfaces of the second trenches 115. During the formation of the first buried layers 124, silicon oxide layers 108 included in the multi-layered mask patterns 110 are etched and removed, and silicon nitride layers 106 included in the multi-layered mask patterns 110 are partially removed. The first and second impurity regions 120 are formed in portions of the active regions 111 and the pre-active pillars 112, which are located around the first buried layers 124.

Figure 11:
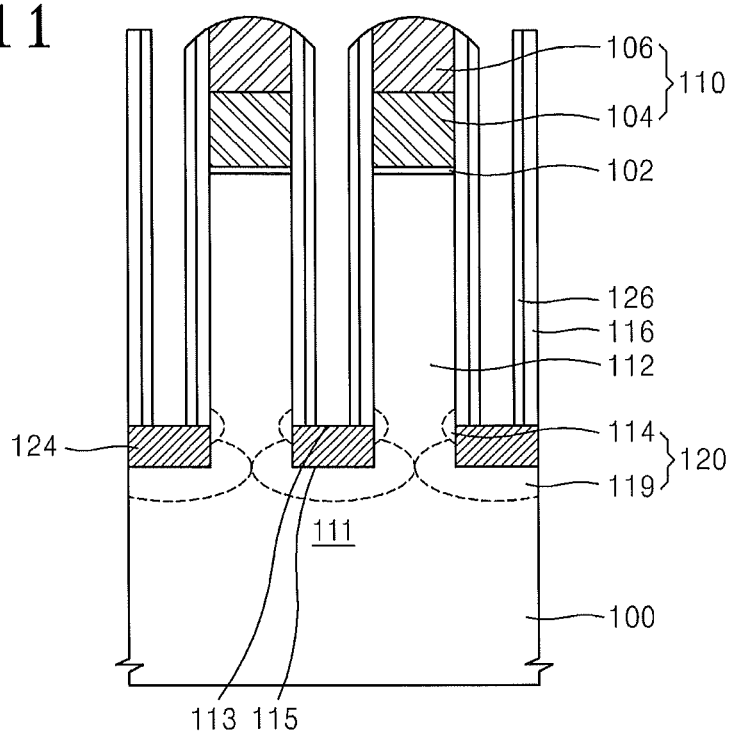
Figure 12:
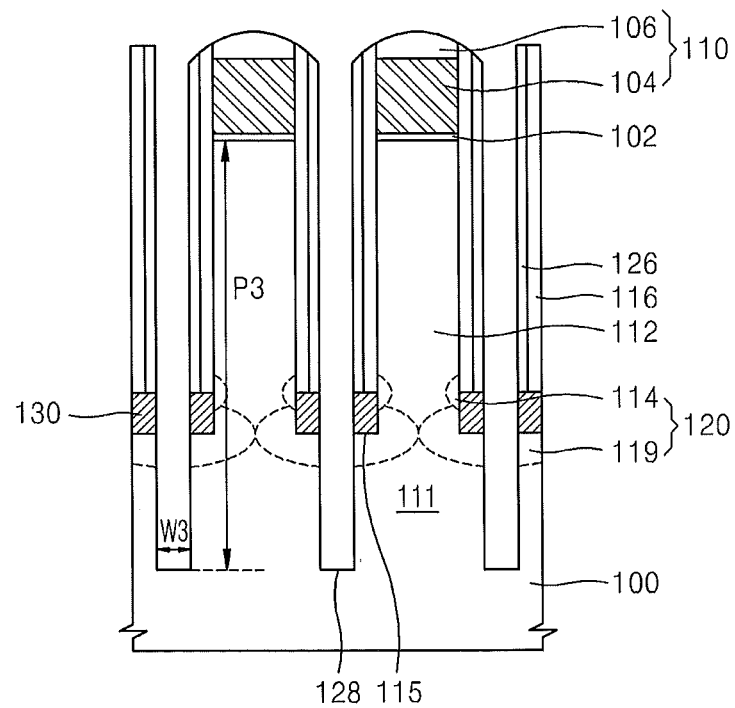

Referring to FIGS. 11 and 12, second spacers 126 are formed on portions of the first buried layers 124, and lateral surfaces of the first spacers 116 that are formed on the lateral or sidewall surfaces of the pre-active pillars 112, the pad oxide layer patterns 102, and the multi-layered mask pattern 110. The second spacers 126 are formed on the lateral or sidewall surfaces of the first spacers 116 formed on the internal surfaces of the first trenches 113, and the portions of the first buried layers 124. The second spacers 126 may be silicon nitride layers.

Then, as illustrated in FIG. 12, the first buried layers 124 and the active region 111 of the substrate 100 are etched by using the multi-layered mask patterns 110, the first spacers 116, and the second spacers 126 as an etch mask, to form third trenches 128 having a width W3, and a third depth P3 that is measured to a lower surface of each third trench 128 from the upper surface of the substrate, and the buried bit lines 130 are formed on bottom portions of the second trenches 115, so as to be aligned with the second spacers 126.

The buried bit lines 130 are formed on the bottom portions of the second trenches 115 between the pre-active pillars 112. The buried bit lies 130 are formed on sides of the pre-active pillars 112. The buried bit lines 130 are located in a lower level than upper surfaces of the pre-active pillars 112.

Figure 13:
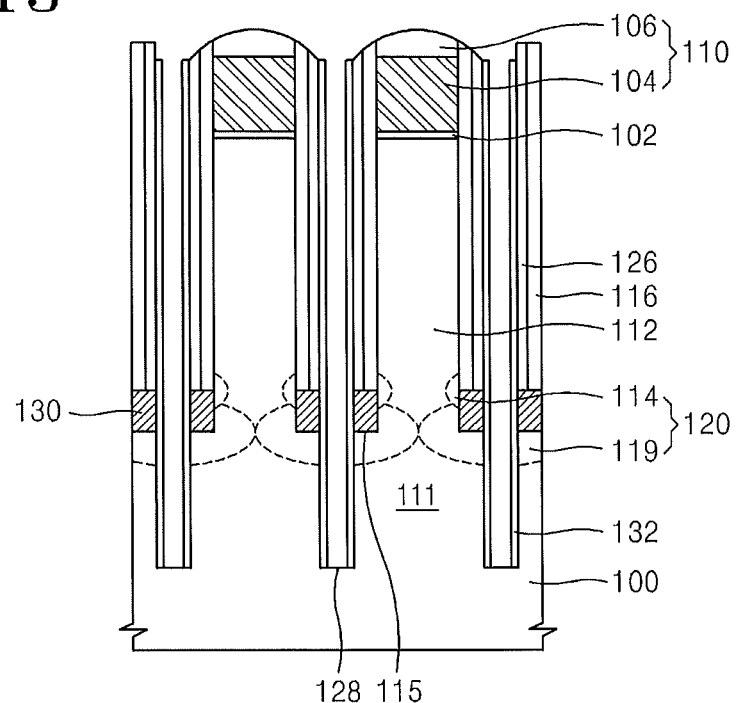

Referring to FIG. 13, first shield insulating layers 132 are formed on lateral or sidewall surfaces of the third trenches 128 and portions of the buried bit lines 130. The first shield insulating layers 132 are formed only on the lateral or sidewall surfaces of the third trenches 128, not on the lower surfaces of the third trenches 128. Each of the first shield insulating layers 132 may be a silicon oxide layer. The first shield insulating layer 132 may be formed by forming and etching a silicon oxide layer in the third trenches 128. The first shield insulating layers 132 are formed in order to insulate first shield lines from each other, which are to be formed in order to reduce a capacitance between the buried bit lines 130.

Figure 14:
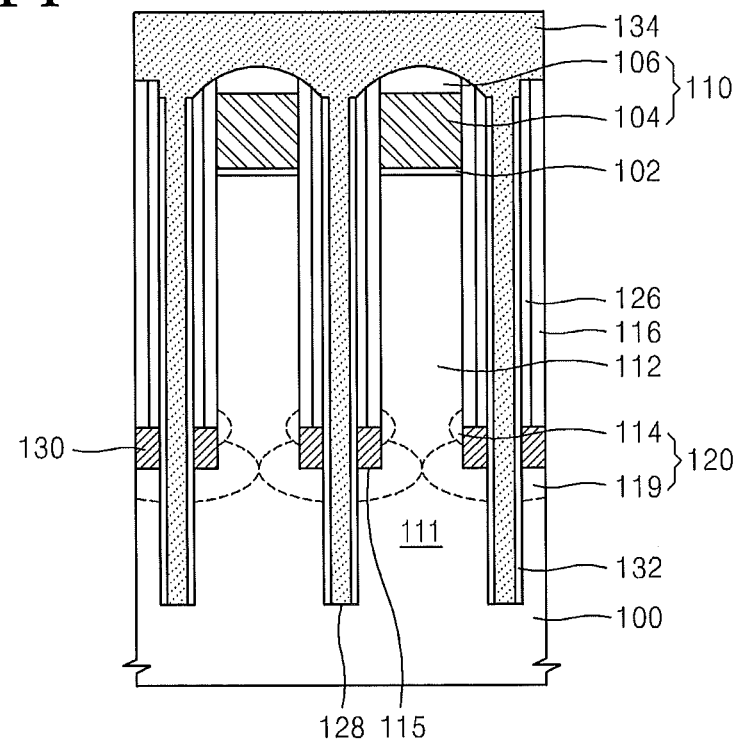
Figure 15:
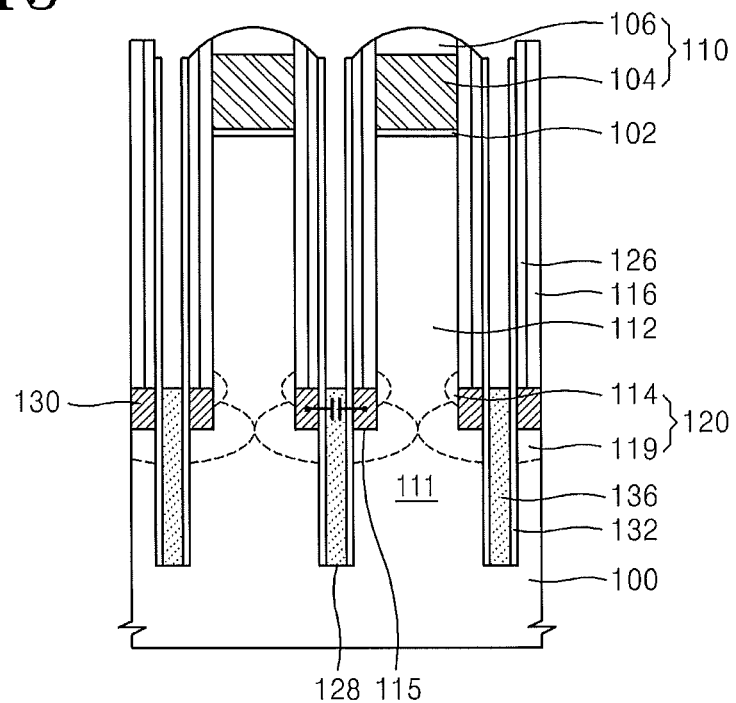

Referring to FIGS. 14 and 15, a second conductive layer 134 that fills and covers the third trenches 128 is formed by depositing a conductive material on a resulting structure where the first shield insulating layers 132 are formed. The second conductive layer 134 is a material layer to be formed as first shield lines later. The second conductive layer 134 may be formed of the same material as that of the first conductive layer 122.

Then, as illustrated in FIG. 15, the second conductive layer 134 is etched-back to form the first shield lines 136 between the buried bit lines 130 in the third trenches 128. The first shield lines 136 may be formed in the same level as surfaces of the buried bit lines 130 from the lower surfaces of the third trenches 128. The buried bit lines 130 are located on sides of each first shield line 136. A capacitance between adjacent ones of the buried bit lines 130 may be reduced by forming the first shield line 136 therebetween. In contrast, if only an insulating layer is formed between the buried bit lines 130 without the first shield line 136, a capacitance between the buried bit lines 130 may be increased.

In FIGS. 14 and 15, the second conductive layer 134 that fills and covers the third trenches 128 is formed and etched-back to form the first shield lines 136 in the third trenches 128. According to another embodiment of the inventive concept, a silicon layer that is selectively doped with impurities, e.g., boron (B), or arsenic (As) is epitaxially grown in the third trenches 128 to form the first shield lines 136 directly in the third trenches 138.

Figure 16:
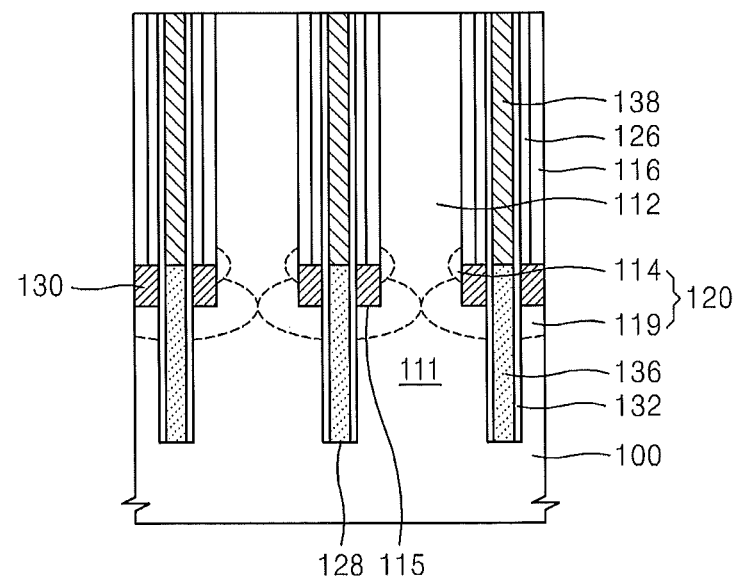

Referring to FIG. 16, an insulating material is deposited on an entire surface of a resulting structure where the first shield lines 136 are formed, so as to fill and cover the third trenches 128, and then the resulting structure is planarized by using a chemical mechanical polishing (CMP) process until the upper surface of the substrate 100 is exposed, to form first buried insulating layers 138. Through such a planarization process, the multi-layered mask patterns 110 and the pad oxide patterns 102 are removed. The first buried insulating layers 138 may be silicon nitride layers. The first buried insulating layers 138 fill the second trenches 128 formed on the first shield lines 136 so as to insulate the pre-active pillars 112 from each other.

Figure 17:
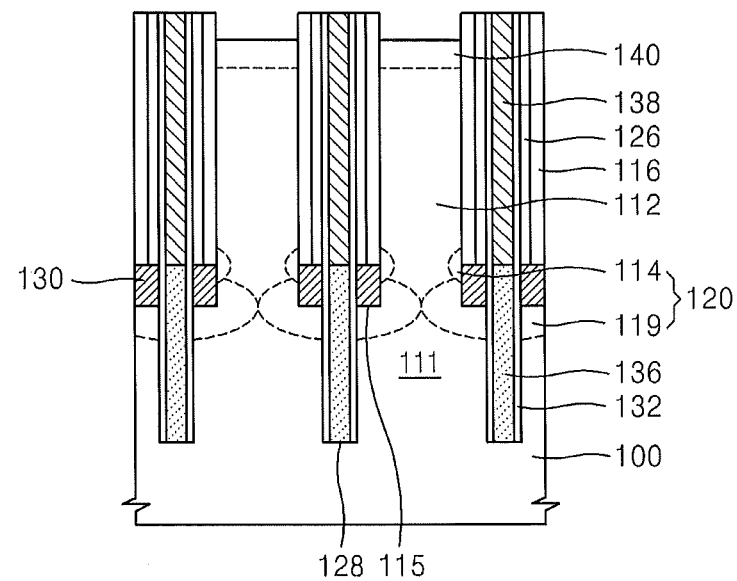

Referring to FIG. 17, upper surfaces of the pre-active pillars 112 are partially etched-back. Accordingly, the upper surfaces of the pre-active pillars 112 are located in a lower level than upper surfaces of the first buried insulating layers 138, the first spacers 116, and the second spacers 126.

Third impurity regions 140 for forming second source/drain regions are formed on the pre-active pillars 112. The third impurity regions 140 are formed by using an ion injection operation, like the first impurity regions 114 and the second impurity regions 119. The third impurity regions 140 may also include low-concentration and high-concentration regions. The third impurity regions 140 include impurity ions having the same conductivity type as in the first and second impurity regions 114 and 119 that define the first source/drain regions 120. The ion injection operation for forming the third impurity regions 140 may be performed after the first buried insulating layers 138 are formed, which has been described with reference to FIG. 16.

Figure 18:
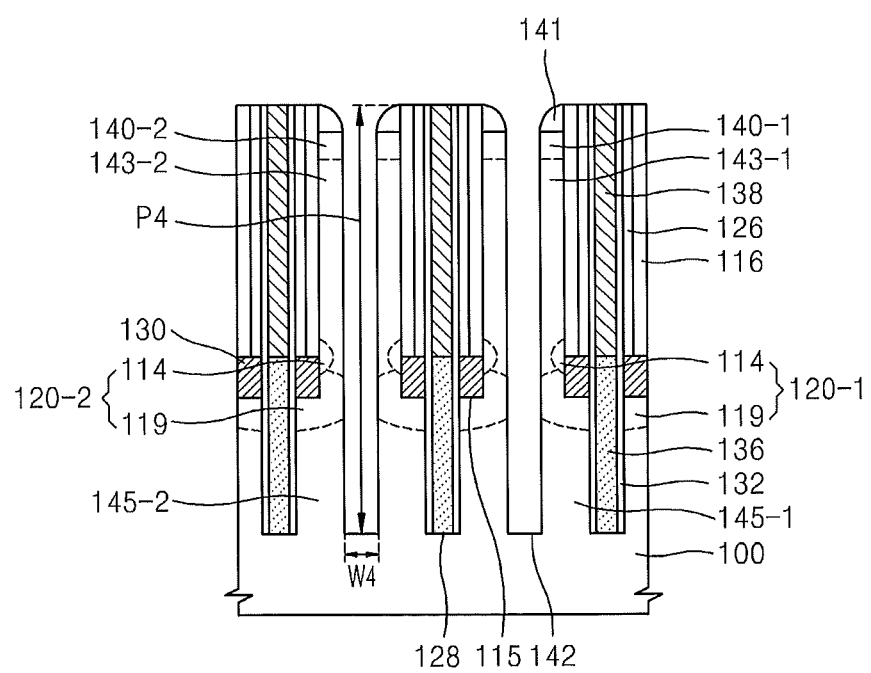

Referring to FIG. 18, third spacers 141 are formed on lateral or sidewall surfaces of the second spacers 126 formed on the recessed pre-active pillars 112. The third spacers 141 may be oxide layers. Then, the pre-active pillars 112 and the active region of the substrate 100 are etched by using the third spacers 141 as an etch mask.

Thus, the first and second active pillars 143, and fourth trenches 142 having a width W4, and a fourth depth P4 that is measured to a lower surface of each fourth trench 142 from an upper surface of the substrate 100 are formed. The fourth trenches 142 are formed between the active pillars 143. The fourth depth P4 of the fourth trenches 142 may be the same as the third depth P3 of the third trenches 128. Each pre-active pillar 112 is divided into two parts with respect to each fourth trench 142 to form the first active pillar 143-1, and the second active pillar 143-2.

The active region 111 is divided into two parts with respect to each fourth trench 142 to form the first active region 145-1 and the second active region 145-2 below a single pre-active pillar 112. The first impurity region 114 and the second impurity region 119, which are formed around the buried bit lines 130 in a single pre-active pillar 112, are divided into two parts to form the first source and drain regions 120-1 and 120-2. The third impurity region 140 formed at an upper portion of a single pre-active pillar 112 is divided into two parts to form the second source and drain regions 140-1 and 140-2.

The first source and drain regions 120-1, the first active pillar 143-1, and the second source and drain regions 140-1 constitute a single vertical channel transistor. In addition, the first source and drain regions 120-2, the second active pillar 143-2, and the second source and drain regions 140-2 constitute a single vertical channel transistor.

Figure 19:
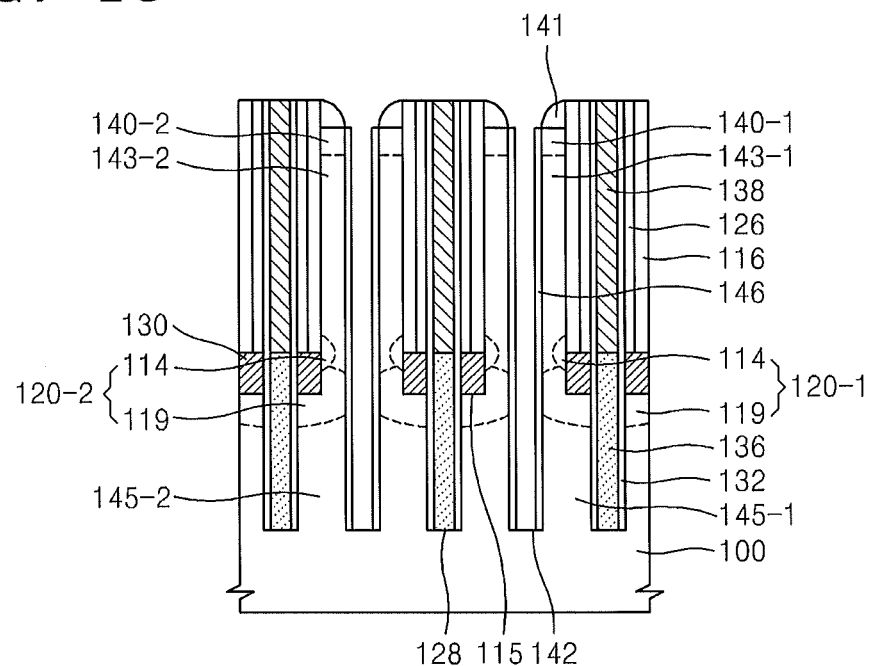

Referring to FIG. 19, second shield insulating layers 146 are formed on lateral or sidewall surfaces of the fourth trenches 142. The second shield insulating layers 146 are formed on only the lateral or sidewall surfaces of the fourth trenches 142, not on lower surfaces of the fourth trenches 142. The second shield insulating layers 146 may each be a silicon oxide layer. The second shield insulating layers 146 may be formed by forming and etching a silicon oxide layer in the fourth trenches 142. The second shield insulating layers 146 are formed in order to insulate seconds shield lines from each other, which are to be formed in order to reduce a capacitance between the buried bit lines 130.

Figure 20:
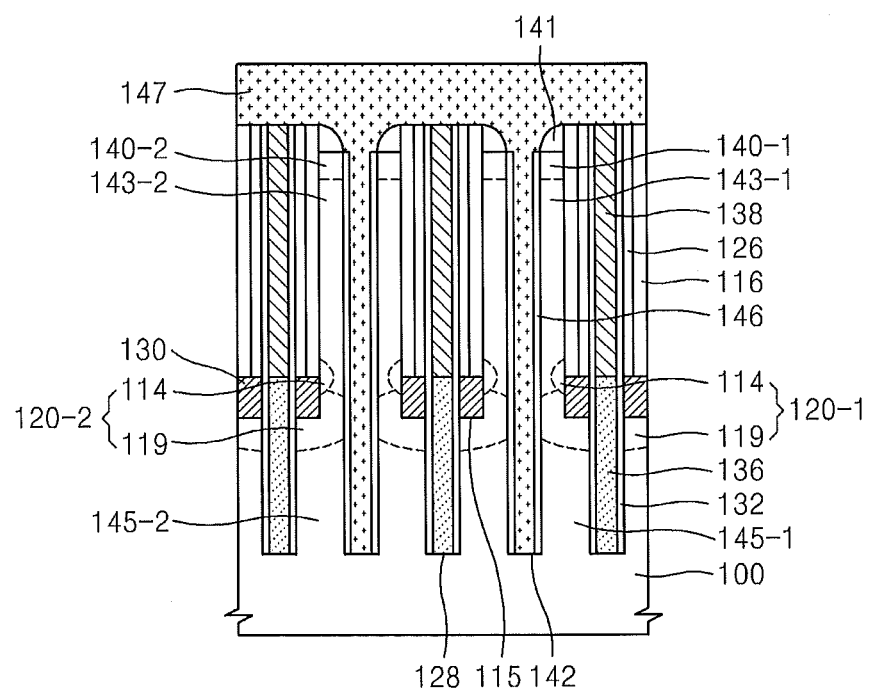
Figure 21:
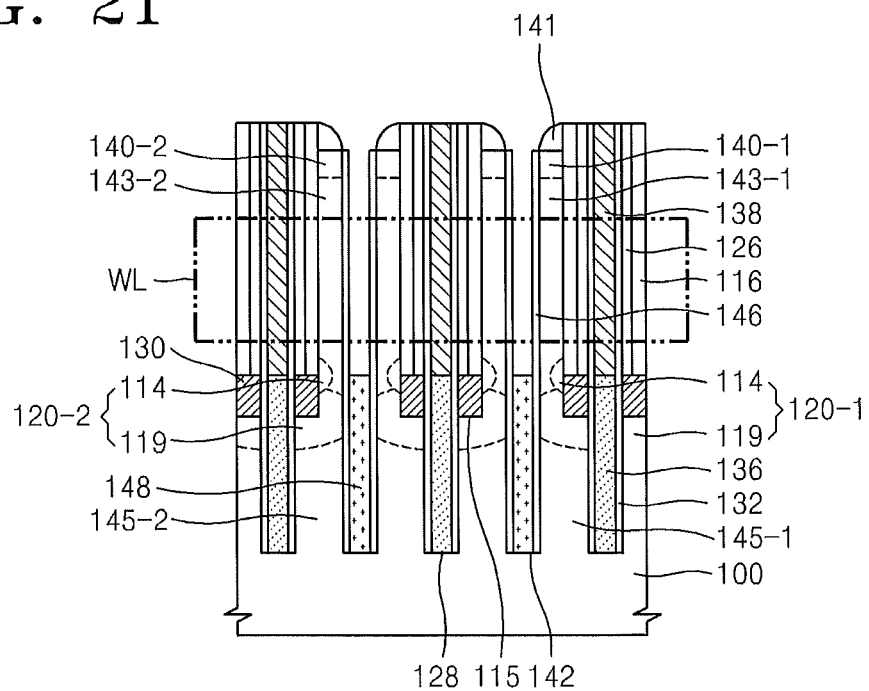

Referring to FIGS. 20 and 21, a conductive material is deposited on a resulting structure where the second shield insulating layers 146 are formed, to form a third conductive layer 147 that fills and covers the fourth trenches 142. The third conductive layer 147 is a material layer to be formed as second shield lines. The third conductive layer 147 may be formed of the same material as the first conductive layer 122 and the second conductive material 134.

Then, as illustrated in FIG. 21, the third conductive layer 147 is etched-back to form second shield lines 148 between the buried bit lines 130 in the fourth trenches 142. The second shield lines 148 may be formed in the same level as surfaces of the buried bit lines 130 from the lower surfaces of the fourth trenches 142. The buried bit lines 130 are located on sides of each second shield line 148. A capacitance between adjacent ones of the buried bit lines 130 may be reduced by forming the second shield lines 148. In contrast, if only an insulating layer is formed between the adjacent buried bit lines 130 without the second shield lines 148, a capacitance between the adjacent buried bit lines 130 may be increased.

In FIGS. 20 and 21, the third conductive layer 147 that fills and covers the fourth trenches 142 is formed and etched-back to form the second shield lines 148 in the fourth trenches 142. According to another embodiment of the inventive concept, a silicon layer that is selectively doped with impurities, e.g., boron (B), or arsenic (As), is epitaxially grown in the fourth trenches 142 to form the second shield lines 148 directly in the fourth trenches 142.

Then, a second buried insulating layer (not shown) is formed in the fourth trenches 142, and a gate insulating layer (not shown) and word lines WL functioning as a gate electrode are formed on the active pillars 143-1 and 143-2, thereby completing the manufacture of a semiconductor device including a vertical channel transistor.

FIGS. 22 through 30 are cross-sectional views for explaining a method of manufacturing a semiconductor device, according to another embodiment of the inventive concept. FIGS. 22 through 30 illustrate a method of manufacturing the semiconductor device described with reference to FIGS. 1 and 2.

The method of FIGS. 22 through 30 is similar to the method of FIGS. 5 through 21, except that a planarization operation of removing the multi-layered mask patterns 110 and the pad oxide patterns 102 is performed. In greater detail, according to the present embodiment, operations of FIGS. 5 through 13 are previously performed, and then operations of FIGS. 22 through 30 are performed.

Figure 22:
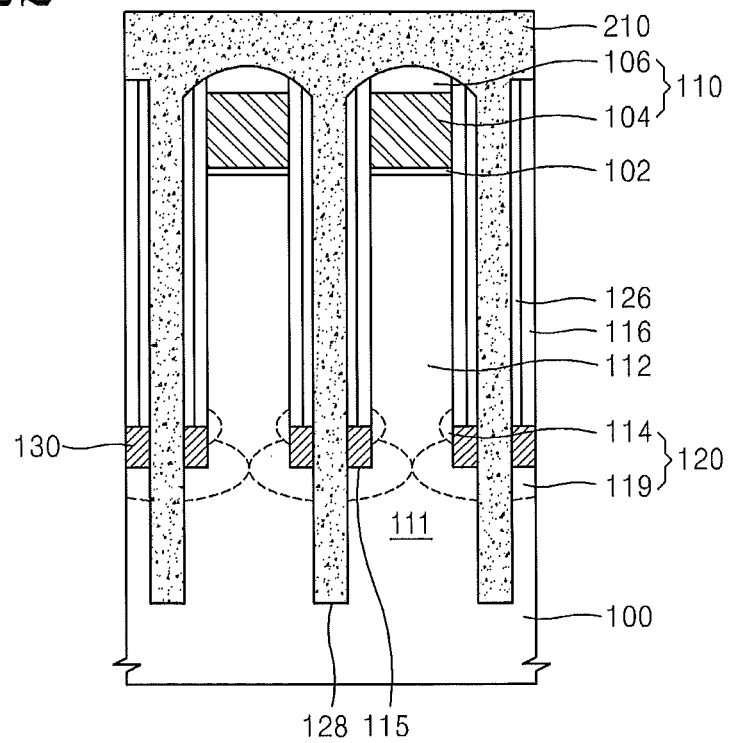
FIGS. 22 through 30 are cross-sectional views for explaining a method of manufacturing a semiconductor device, according to another embodiment of the inventive concept.
Figure 23:
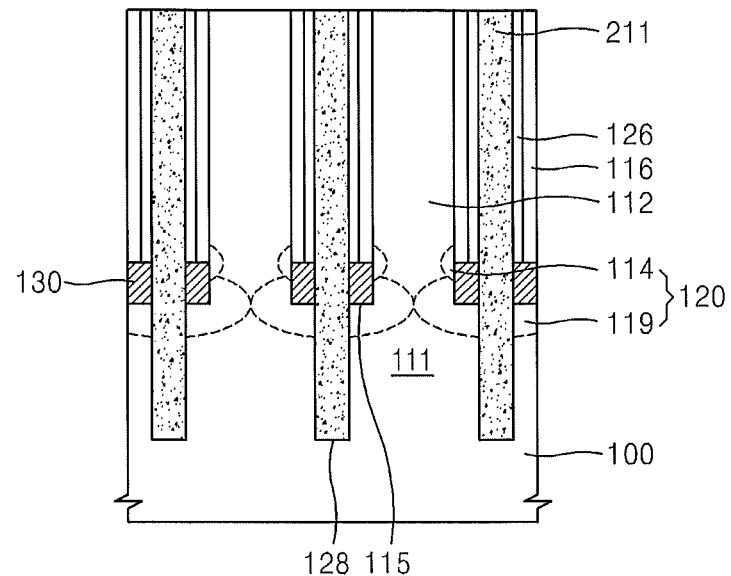

Referring to FIGS. 22 and 23, an insulating material is deposited on a resulting structure where the first and second spacers 116 and 126 are formed, to form a first insulating layer 210 that fills and covers the third trenches 128. The first insulating layer 210 may be a silicon nitride layer. Then, as illustrated in FIG. 23, the first insulating layer 210, the multi-layered mask patterns 110, and the pad oxide patterns 102 are planarized to form a first buried insulating layer 211 that is buried in the third trenches 128.

Figure 24:
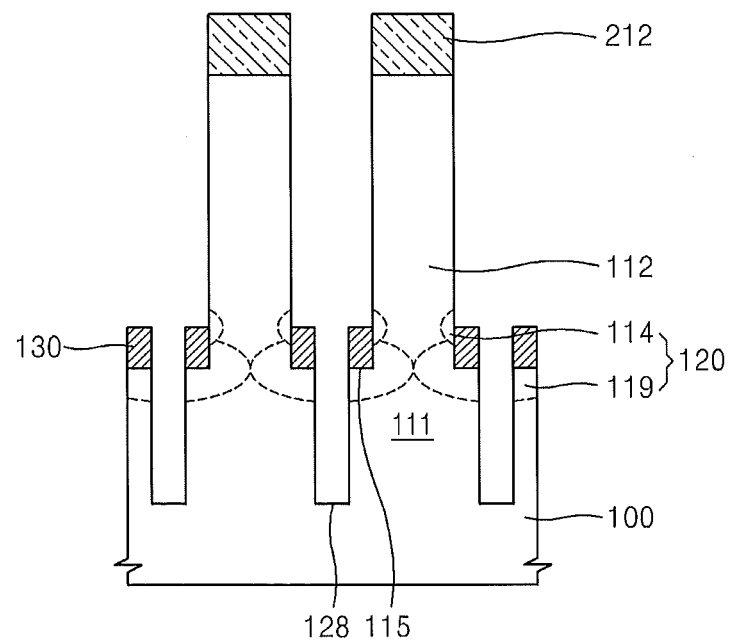
Figure 25:
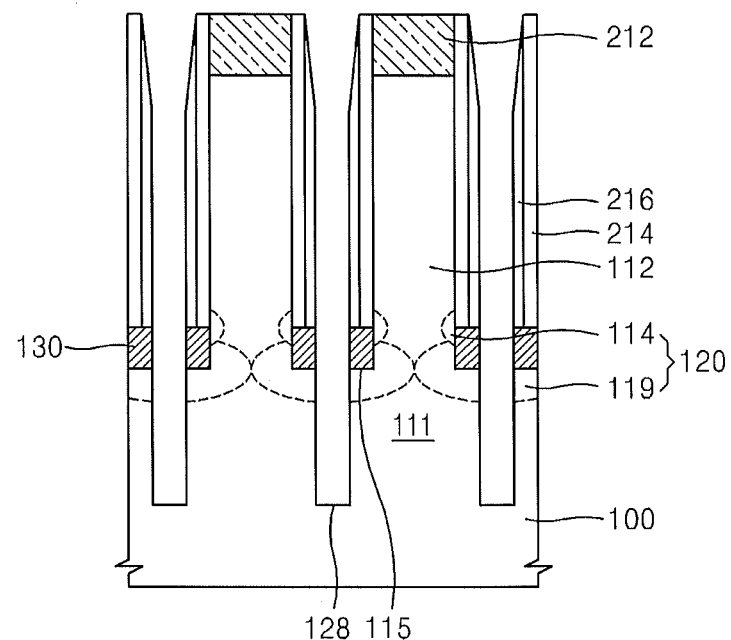

Referring to FIGS. 24 and 25, second mask patterns 212 are formed on the pre-active pillars 112, and then the first spacers 116, and the second spacers 126 are removed by using the second mask patterns 212 as an etch mask. Thus, the third trenches 128 and the buried bit lines 130 are exposed on the substrate 100.

Then, as illustrated in FIG. 25, third spacers 214 are formed on lateral or sidewall surfaces of the pre-active pillars 112 formed on the buried bit lines 130. The third spacers 214 may be silicon oxide layers. Fourth spacers 216 are formed on the third spacers 214 formed on the lateral or sidewall surfaces of the pre-active pillars 112 formed on the buried bit lines 130. The fourth spacers 216 may be silicon nitride layers.

Figure 26:
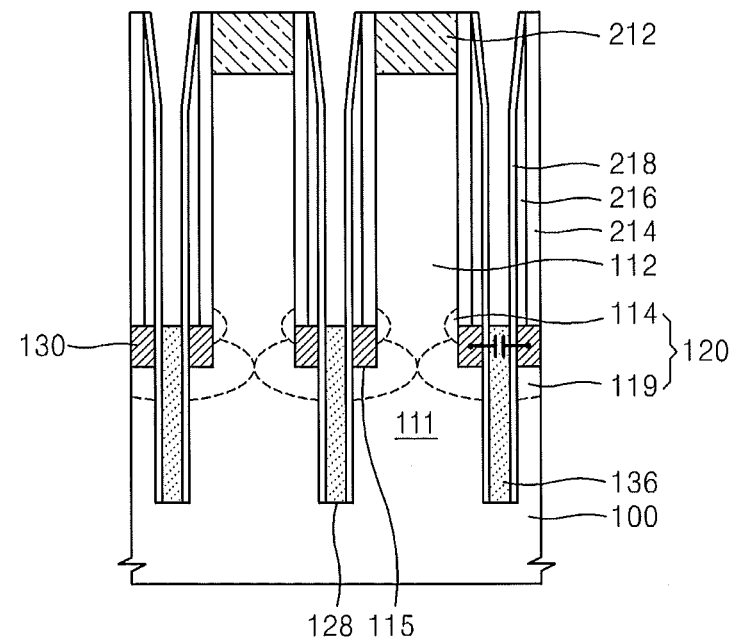

Referring to FIG. 26, first shield insulating layers 218 are formed on internal surfaces of the third trenches 128. The first shield insulating layers 218 are formed only on the lateral or sidewall surfaces of the third trenches 128, not on the lower surfaces of the third trenches 128. The first shield insulating layers 218 are silicon oxide layers. The first shield insulating layers 218 corresponds to the first shield insulating layers 132 that have been described with reference to FIGS. 5 through 21. The first shield insulating layers 218 are formed in order to insulate first shield lines from each other, which are to be formed in order to reduce a capacitance between the buried bit lines 130.

Then, the first shield lines 136 are formed in the third trenches 128 by using the same method as the method described with reference to FIGS. 5 through 21, and thus a capacitance between the buried bit lines 130 is reduced. The first shield lines 136 may be formed by forming and etching-back a third conductive layer that fills and covers the third trenches 128. In addition, the first shield lines 136 may be formed by epitaxially growing a silicon layer that is selectively doped with impurities, e.g., B, or As, in the third trenches 128.

Figure 27:
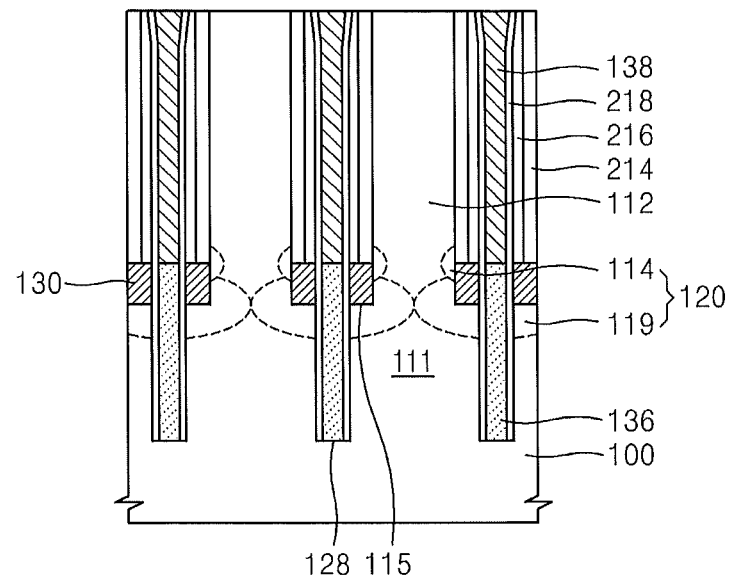

Referring to FIG. 27, an insulating material is deposited on an entire surface of a resulting structure where the first shield lines 136 are formed, so as to fill and cover the third trenches 128, and then the resulting structure is planarized by using a chemical mechanical polishing (CMP) process until the upper surface of the substrate 100 is exposed, to form first buried insulating layers 138. The first buried insulating layers 138 may be silicon nitride layers. The first buried insulating layers 138 fill the second trenches 128 formed on the first shield lines 222 so as to insulate the pre-active pillars 112 from each other.

Figure 28:
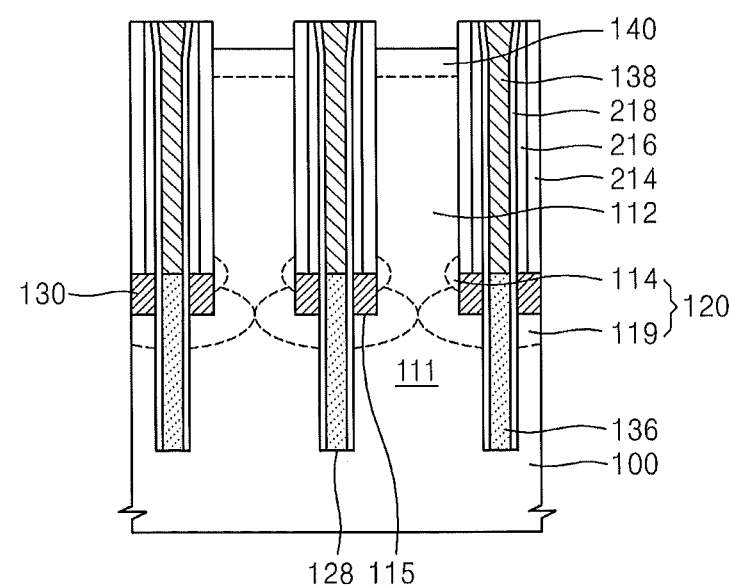

Referring to FIG. 28, upper surfaces of the pre-active pillars 112 are partially etched-back. Accordingly, the upper surfaces of the pre-active pillars 112 are located in a lower level than upper surfaces of second buried insulating layers 224, the third spacers 214, and the fourth spacers 216.

The third impurity regions 140 for forming second source and drain regions are formed on the pre-active pillars 112. The third impurity regions 140 are formed by using the same method as the method described with reference to FIGS. 5 through 21. The ion injection operation for forming the third impurity regions 140 may be performed after the first buried insulating layers 138 are formed.

Figure 29:
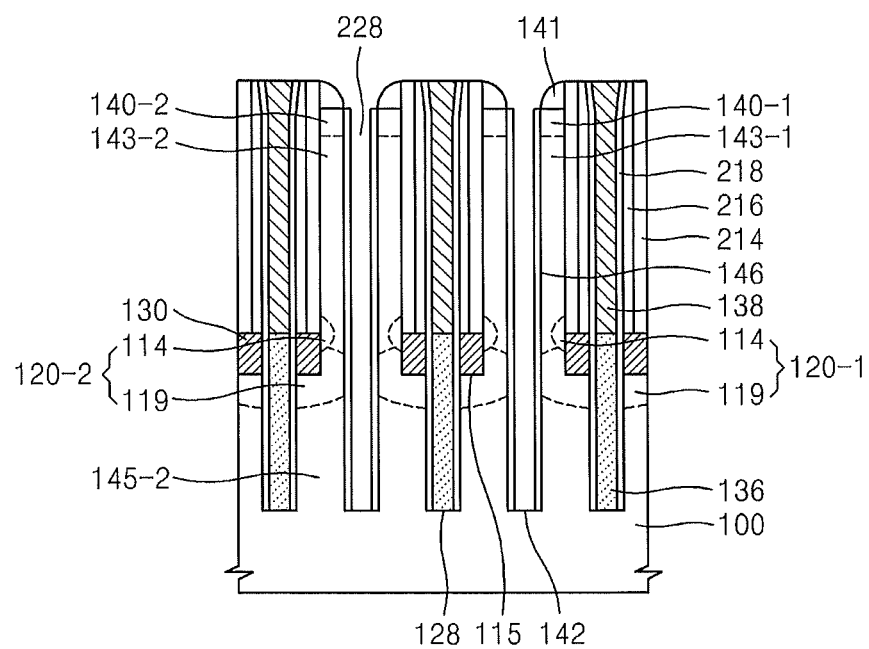

Referring to FIG. 29, fifth spacers 141 are formed on lateral or sidewall surfaces of the fourth spacers 216 formed on the recessed pre-active pillars 112. The fifth spacers 141 may be oxide layers. Then, the pre-active pillars 112 and the active region of the substrate 100 are etched by using the fifth spacers 141 as an etch mask.

Thus, like in FIGS. 5 through 21, the fourth trenches 142 having a width W4, and a fourth depth P4 that is measured to a lower surface of each fourth trench 142 from an upper surface of the substrate 100 are formed. In addition, the active pillars 143-1 and 143-2, the first active regions 145-1, the second active regions 145-2, the first source and drain regions 120-1 and 120-2, and the second source and drain regions 140-1 and 140-2 are formed.

Figure 30:
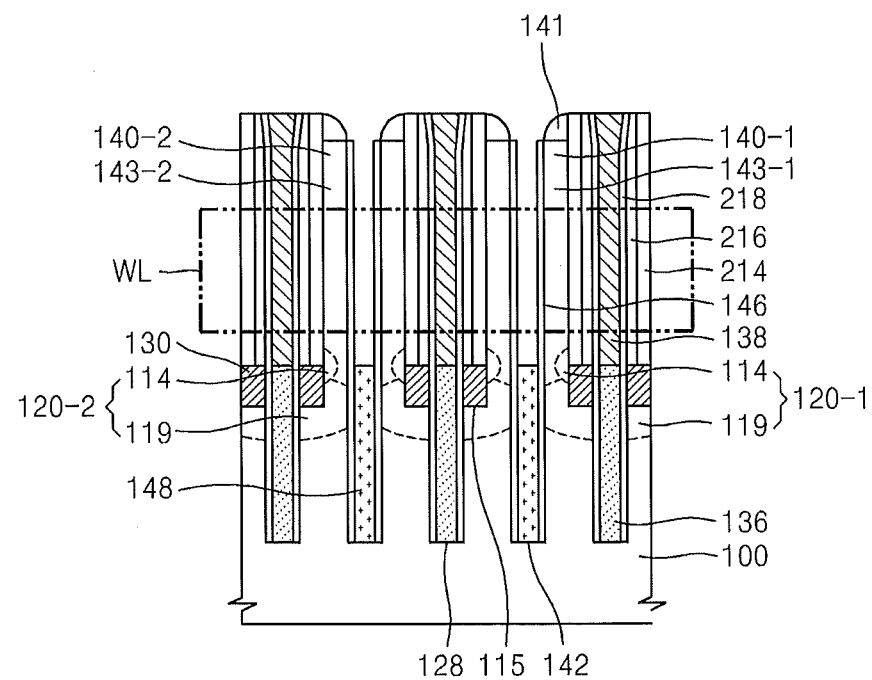

Referring to FIG. 30, the second shield insulating layers 146 are formed on internal surfaces of the fourth trenches 142. The second shield insulating layers 146 are formed only on the lateral or sidewall surfaces of the fourth trenches 142, not on the lower surfaces of the fourth trenches 142. The second shield insulating layers 146 may be silicon oxide layers. The second shield insulating layers 146 are formed in order to insulate second shield lines 148 from each other, which are to be formed in order to reduce a capacitance between the buried bit lines 130.

Then, the second shield lines 148 are formed in the fourth trenches 142 by using the same method as the method described with reference to FIGS. 5 through 21, and thus a capacitance between the buried bit lines 130 may be reduced. The second shield lines 148 are formed by filling and covering the fourth trenches 142 with a third conductive layer and then etching-back the third conductive layer. The second shield lines 148 may be formed by epitaxially growing a silicon layer that is selectively doped with impurities, e.g., B, or As, in the forth trenches 142. Then, a second buried insulating layer (not shown) is formed in the fourth trenches 142, and a gate insulating layer (not shown) and word lines WL functioning as a gate electrode are formed on the active pillars 143-1 and 143-2, thereby completing the manufacture of a semiconductor device including a vertical channel transistor.

FIGS. 31 through 38 are cross-sectional views for explaining a method of manufacturing a semiconductor device, according to another embodiment of the inventive concept. FIGS. 31 through 38 illustrate a method of manufacturing the semiconductor device described with reference to FIGS. 3 and 4. In FIGS. 31 through 38, the semiconductor device is manufactured by using a junction substrate (junction wafer).

Figure 31:
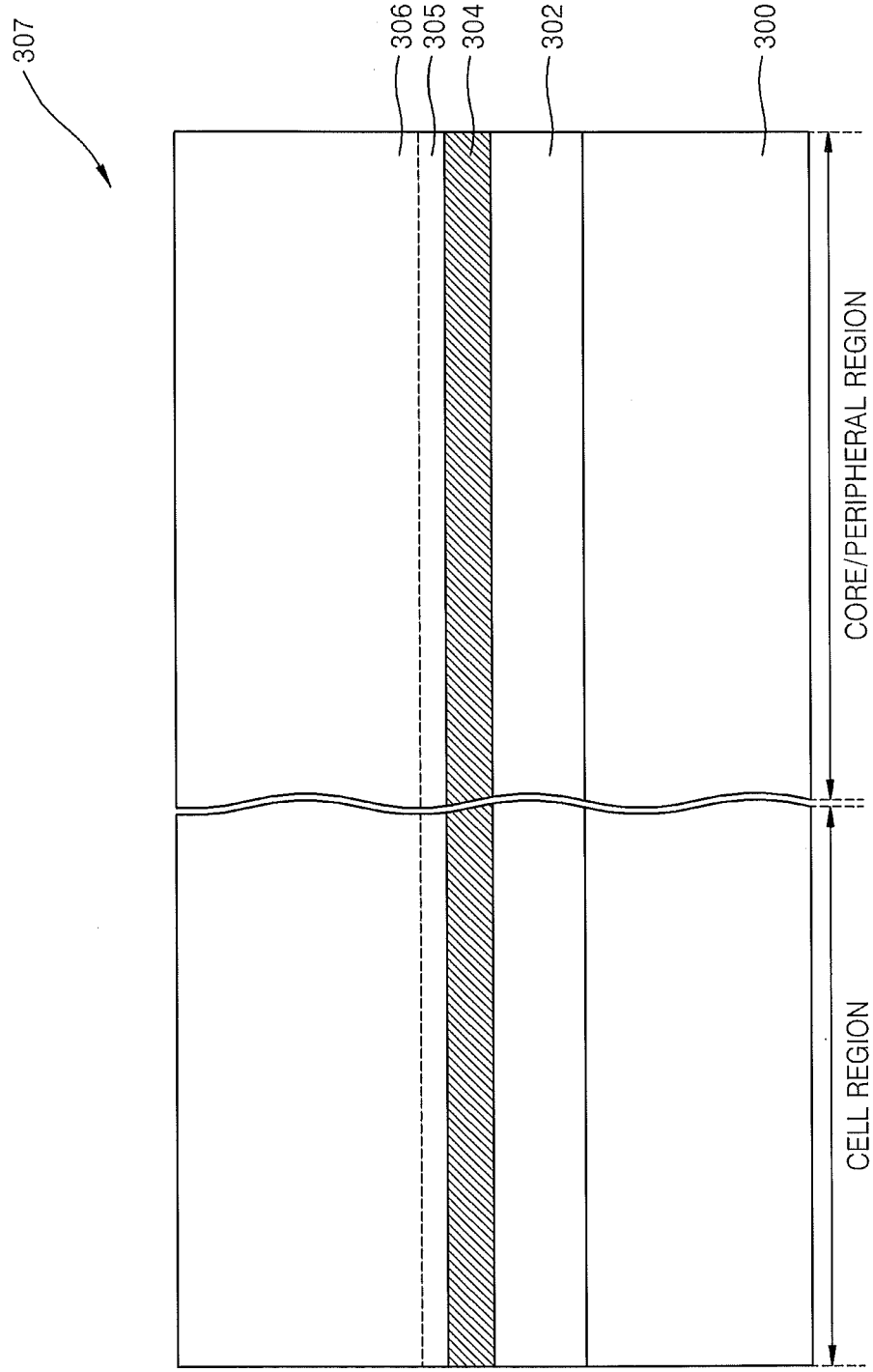
FIGS. 31 through 38 are cross-sectional views for explaining a method of manufacturing a semiconductor device, according to another embodiment of the inventive concept.

Referring to FIG. 31, the semiconductor device according to the present embodiment is manufactured by using the junction wafer. First, a first wafer 300 is prepared. The first wafer 300 may be a silicon wafer. Then, a second wafer 306 is prepared, impurity regions to be used as the first source and drain regions 305 are formed in the second wafer 306, and a first conductive layer 304 and a junction oxide layer 302 are formed on the first source and drain regions 305. The second wafer 306 may also be a silicon wafer. Then, after the second wafer 306 is reversed, the second wafer 306 is adhered to the first wafer 300 by using the junction oxide layer 302 as a medium, thereby completing formation of a junction wafer including the first conductive layer 304.

Hereinafter, the second wafer 306 will be referred to as a second substrate, and the first wafer 300 will be referred to as a first substrate. A substrate including the junction oxide layer 302 and the first conductive layer 304 that are formed between the first substrate 300 and the second substrate 306 will be referred to as a junction substrate 307. The junction substrate 307 may be divided into a cell region, and a core/peripheral region other than the cell region.

Figure 32:
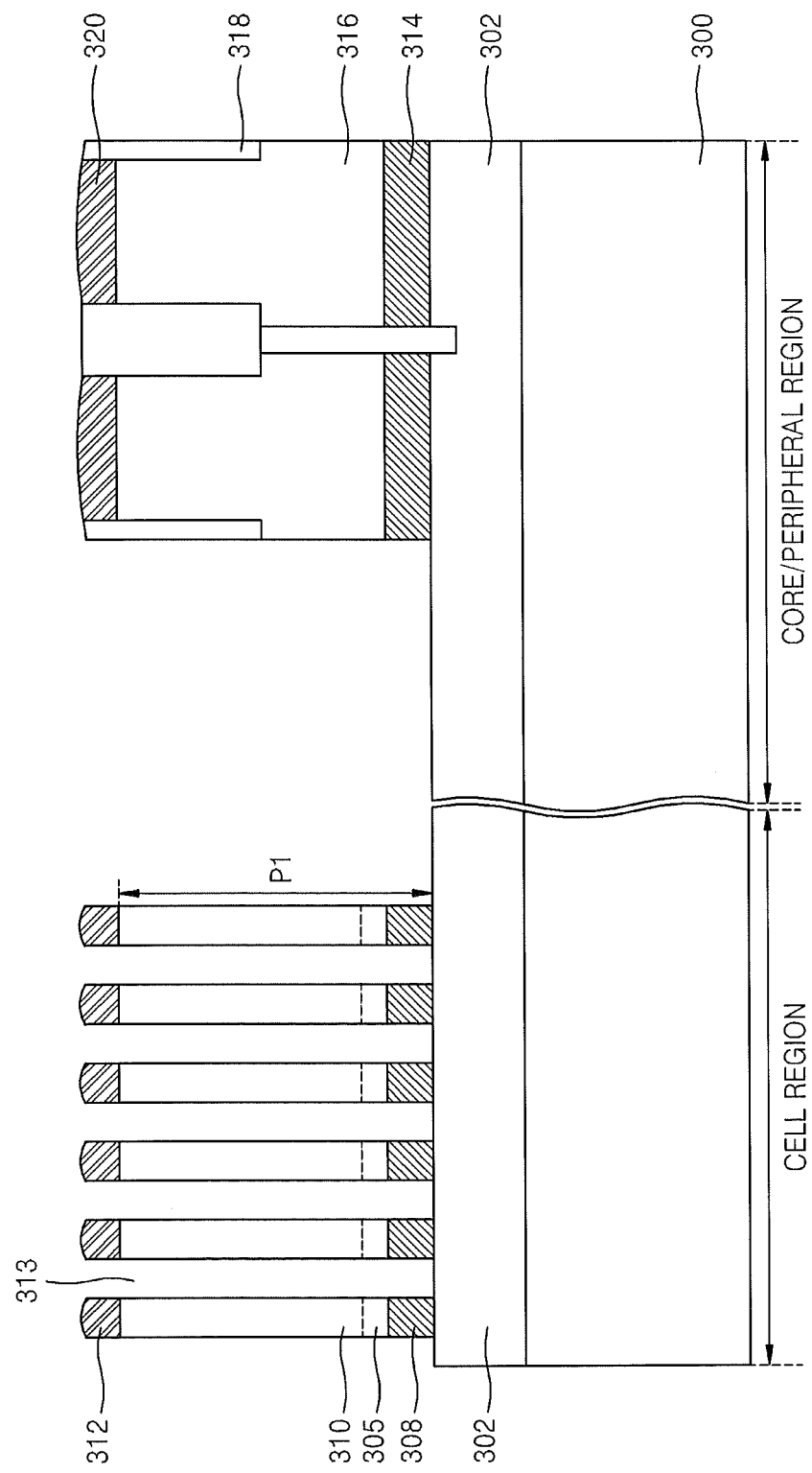

Referring to FIG. 32, mask patterns 312 are formed on the second substrate 306 in the cell region, and the second substrate 306 and the first conductive layer 304 are sequentially etched to form the active pillars 310 and the buried bit lines 308. The mask patterns 312 are silicon nitride layers. The buried bit lines 308 are formed so as to contact lower portions of the active pillars 310. First trenches 313 exposing the junction oxide layer 302 therethrough are formed between the active pillars 310 and the buried bit lines 308. Lower surfaces of the buried bit lines 308 are formed to a depth P1 from an upper surface of the second substrate 306. In the core/peripheral region, a metal pattern 314, a silicon pattern 316, and insulating layer patterns 318 and 320 are formed.

Figure 33:
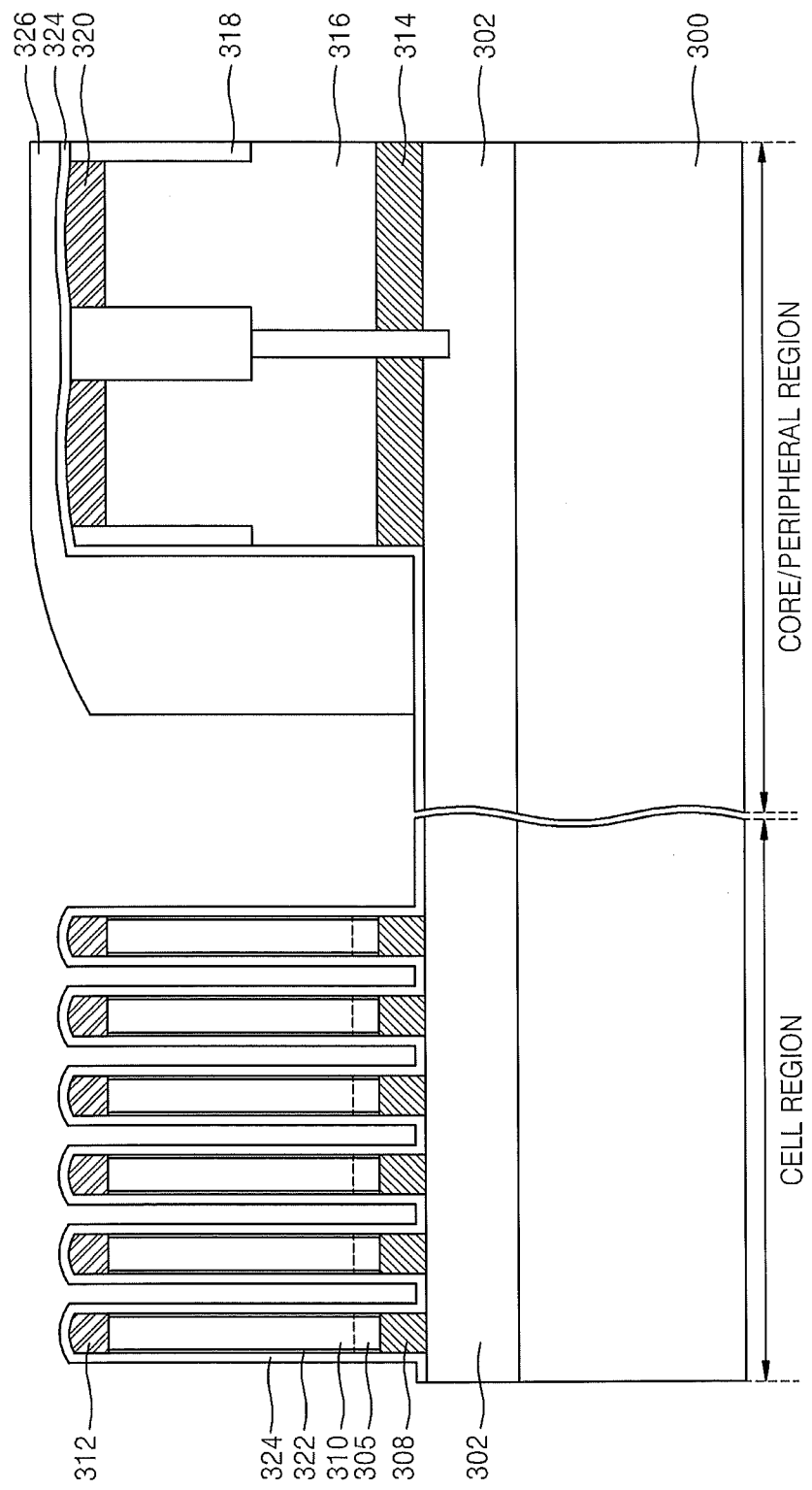

Referring to FIG. 33, silicon oxide layers 322 are selectively formed on lateral or sidewall surfaces of the active pillars 310. The silicon oxide layers 322 are formed in order to prevent the active pillars 310 from being damaged during an etch operation. The silicon oxide layers 322 may be omitted. A shield insulating layer 324 is formed on an entire surface of the junction substrate 307. In the cell region, the shield insulating layer 324 is formed on lateral or sidewall surfaces of the active pillars 310 on which the silicon oxide layers 322 are formed, the mask patterns 312, and the junction oxide layer 302. The shield insulating layer 324 may be a silicon oxide layer. The shield insulating layer 324 is formed in order to insulate the buried bit lines 308 from each other. Then, in the core/peripheral regions, a photoresist pattern 326 is formed by using a photography method. The cell region is exposed by the photoresist pattern 326.

Figure 34:
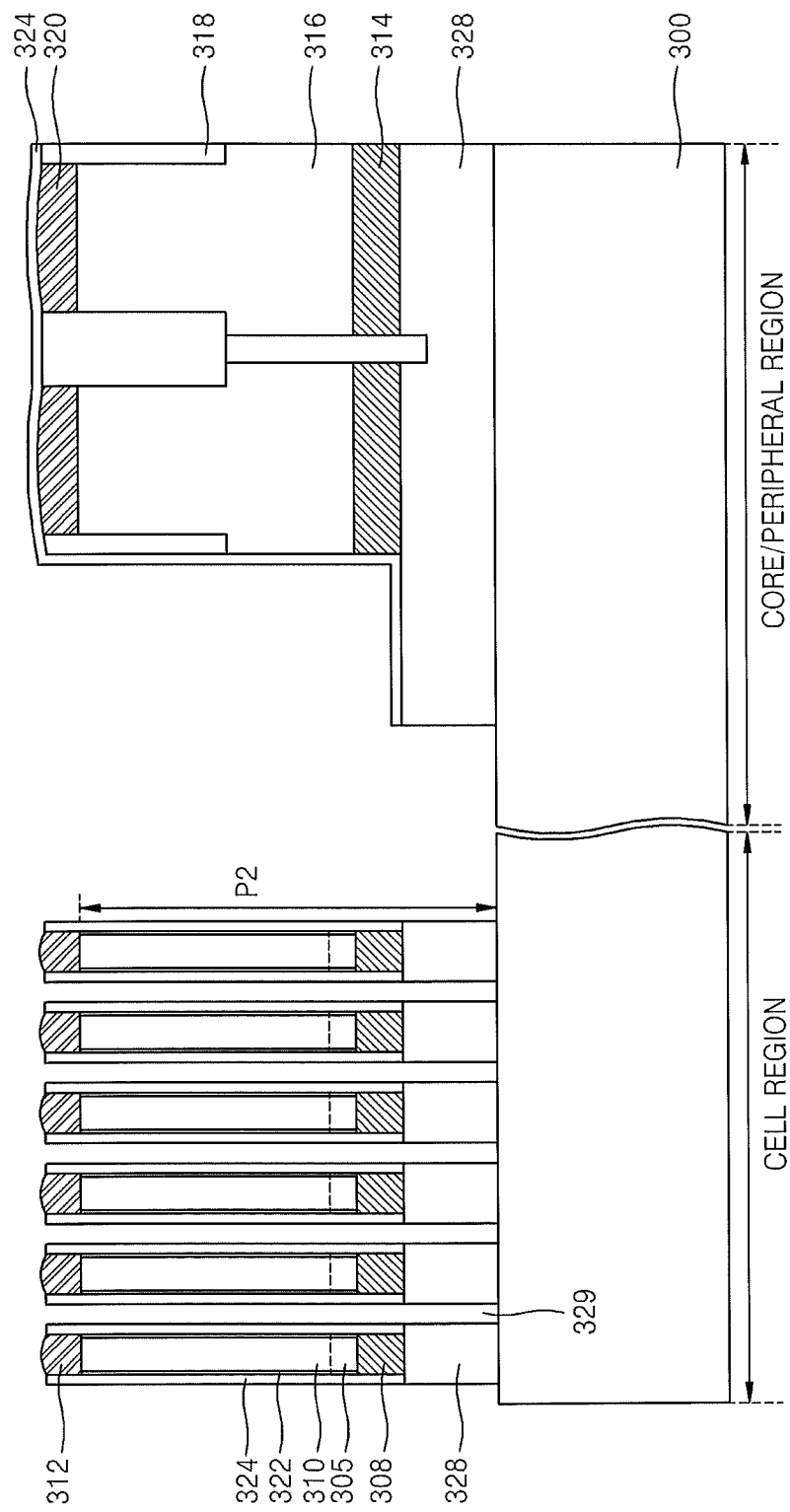

Referring to FIG. 34, the junction oxide layer patterns 328 are formed by etching the junction oxide layer 302 by using the photoresist pattern 326 and mask patterns 312 as a etch mask. Thus, in the cell region, the buried bit lines 308, the active pillars 310, and the mask patterns 312 are stacked on the junction oxide layer patterns 328, and the shield insulating layer 324 remains on the lateral or sidewall surfaces of the active pillars 310 and the buried bit lines 308. Portions of the shield insulating layer 324, which are located on the mask pattern 312, are removed. In the cell region, the junction oxide layer patterns 328 including the second trenches 306 exposing portions of the first substrate 300 therethrough are formed on the first substrate 300. Lower surfaces of the junction oxide layer patterns 328 are formed to a depth P2 from an upper surface of the second substrate 306. The depth P2 is the depth of the second trenches 329. Then, the photoresist pattern 326 is removed.

Figure 35:
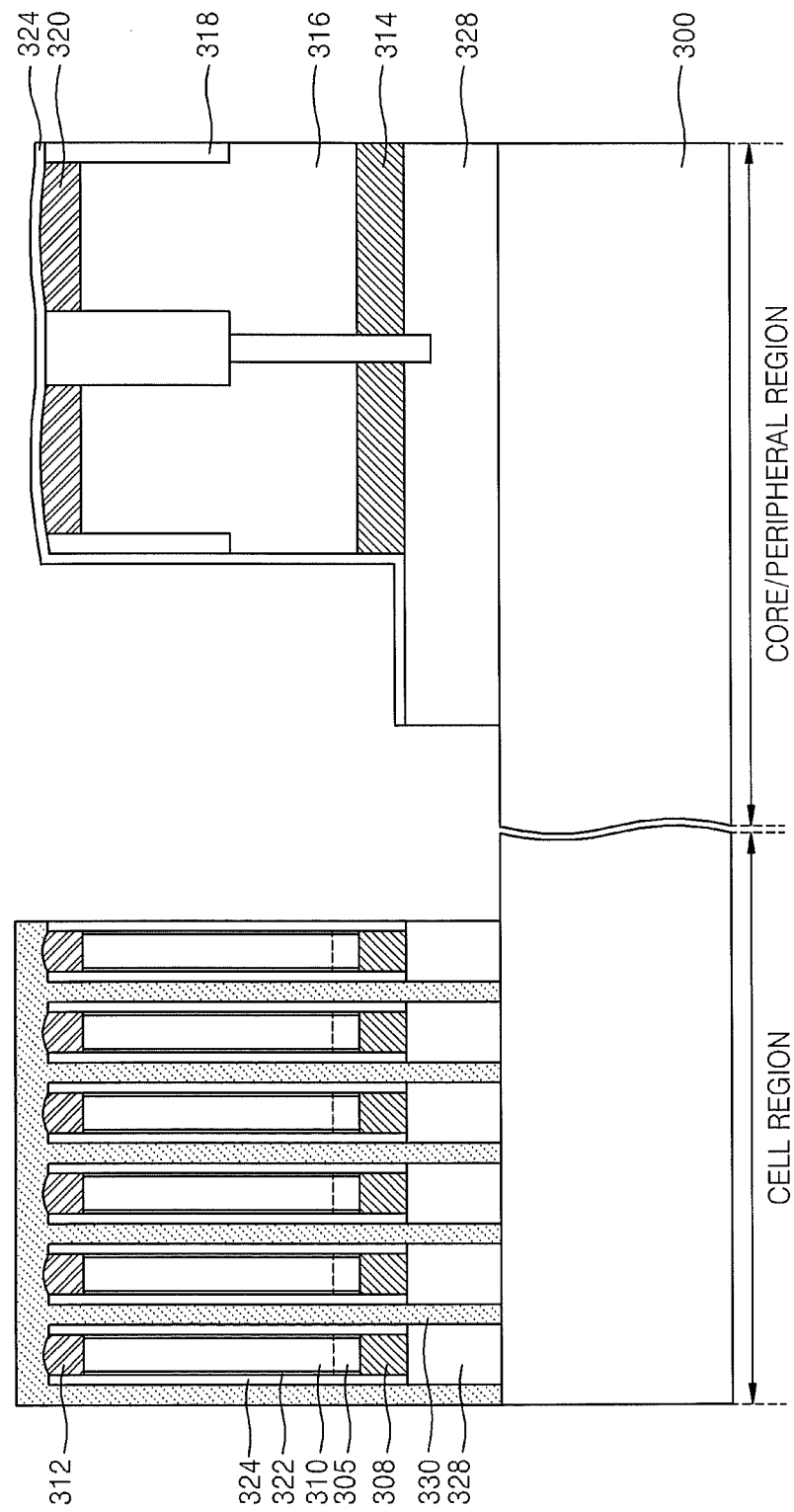
Figure 36:
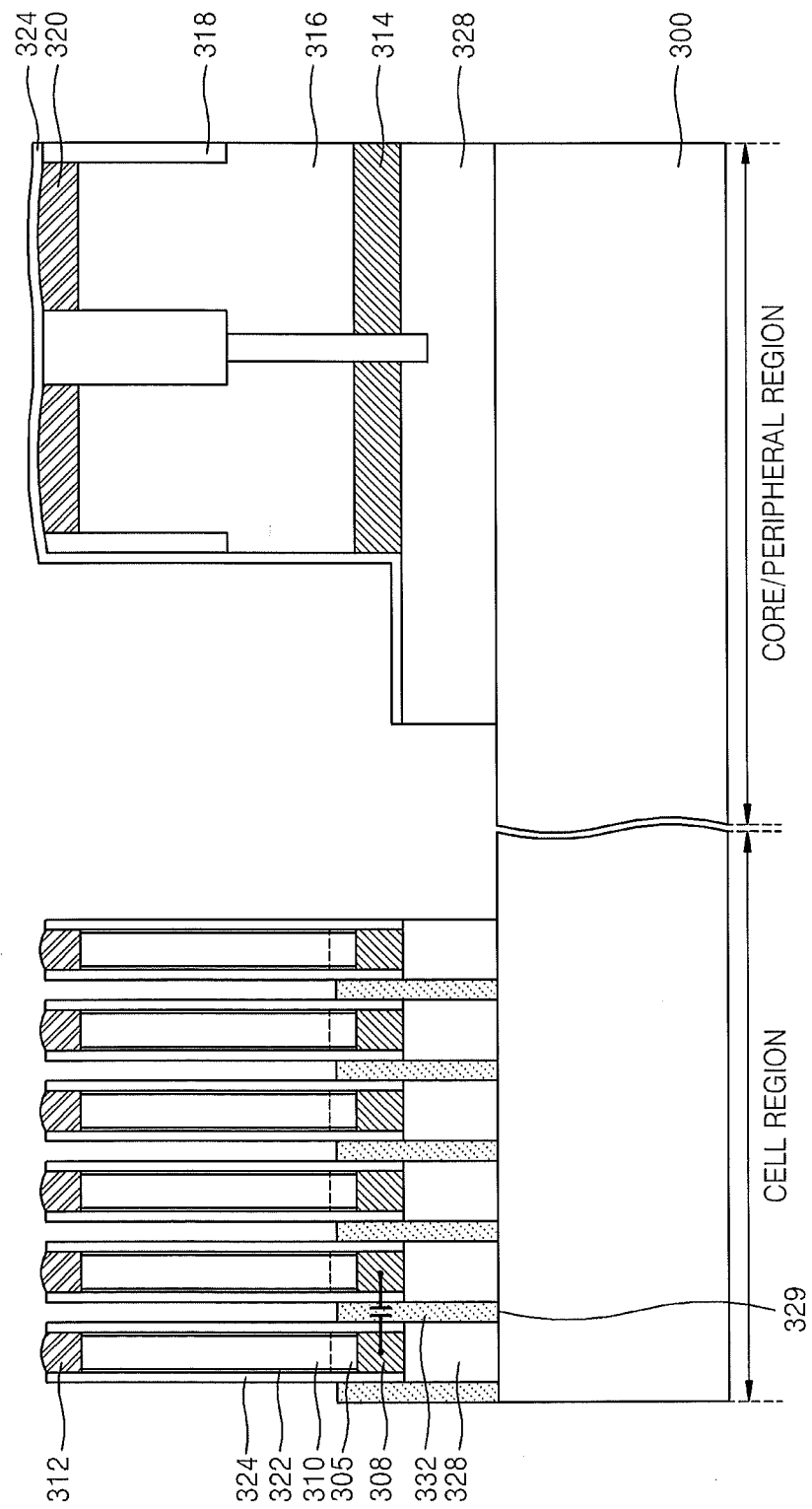

Referring to FIGS. 35 and 36, in the cell region, a conductive material is deposited on a resulting structure where the active pillars 312, the silicon oxide layers 322 and 324, and the mask patterns 312 are formed, to form a second conductive layer 330 that fills and covers the first trenches 313 and the second trenches 329. The second conductive layer 330 is a material layer that is to be formed as a shield line.

The second conductive layer 330 is a material layer to be formed as shield lines. The second conductive layer 330 may be formed of metal such as W, Al, Cu, Mo, Ti, Ta, or Ru. In addition, the second conductive layer 330 may be formed of a metal nitride such as TiN, TiN/W, Ti/TiN, WN, W/WN, TaN, Ta/TaN, TiSiN, TaSiN, or WSiN.

Then, as illustrated in FIG. 36, the second conductive layer 330 is etched-back to form shield lines 332 in the first trench 313 and a second trench 329. Upper surfaces of the shield lines 332 may be formed in a higher level than surfaces of the buried bit lines 308 from lower surfaces of the second trenches 329. The shield lines 332 may be formed in the same level as the buried bit lines 308 from the lower surfaces of the second trenches 329. The buried bit lines 308 are located on sides of the shield lines 332. A capacitance between adjacent ones of the buried bit lines 308 is reduced by forming the shield lines 332 therebetween. In contrast, if only an insulating layer is formed between the adjacent buried bit lines 308 without the shield lines 332, a capacitance between the adjacent ones of the buried bit lines 308 may be significantly increased.

In FIGS. 35 and 36, the second conductive layer 330 that coves and fills the first trenches 313 and the second trenches 329 is formed and etched-back to form the shield lines 332 in the first trenches 313 and the second trenches 329. According to another embodiment of the inventive concept, a silicon layer that is selectively doped with impurities, e.g., B or As, is epitaxially grown in the first trenches 313 and the second trenches 329 to form the shield lines 332 directly in the first trenches 313 and the second trenches 329.

Figure 37:
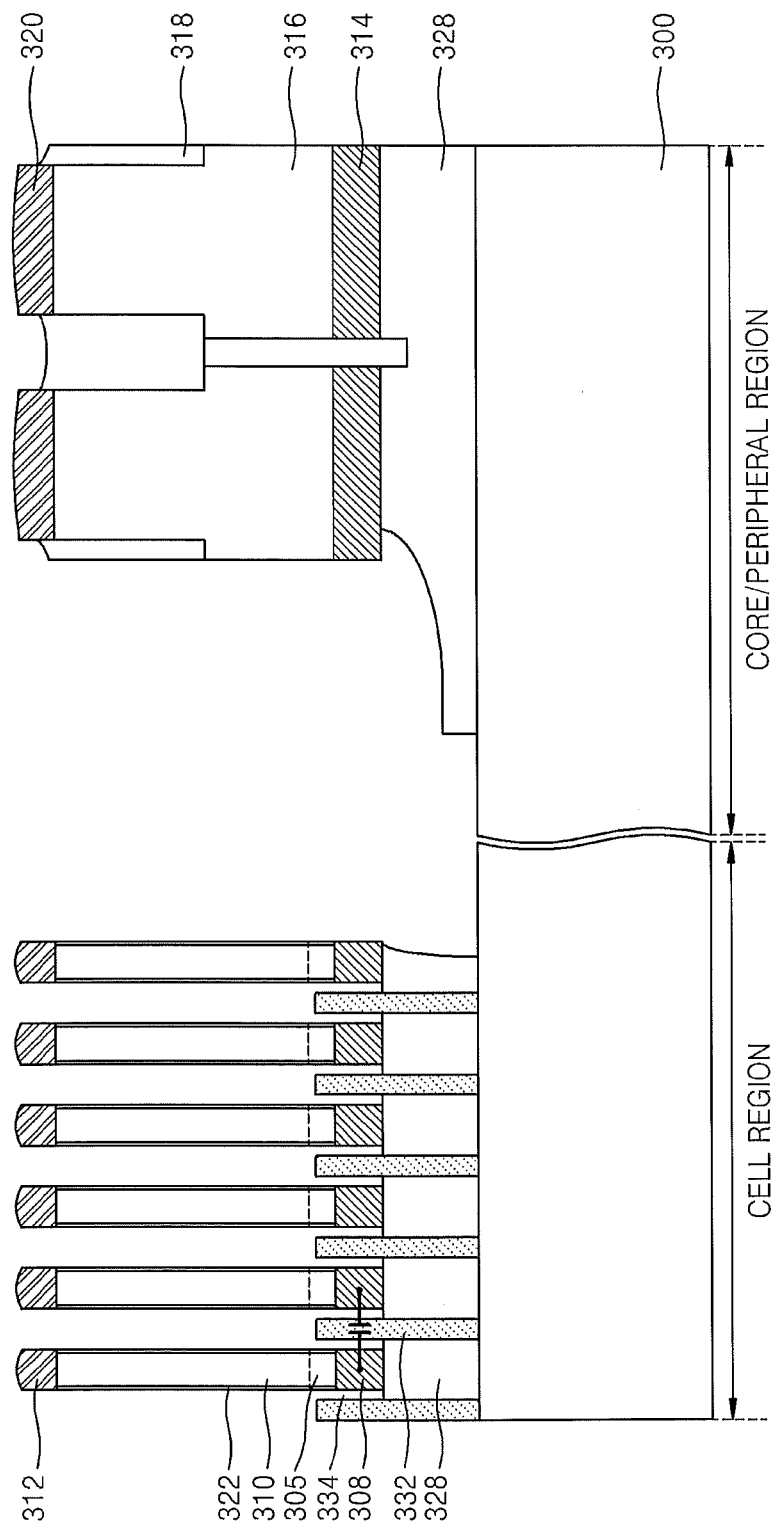

Referring to FIG. 37, according to another embodiment of the inventive concept, the shield insulating layers 324 between the buried bit lines 308 are removed to form air layers 334, that is, air gaps. Inside the first trenches 313 and the second trenches 329, the shield insulating layers 324 between the buried bit lines 308 are removed. In this case, due to the air layers 334, a capacitance between the buried bit lines 308 may be further reduced. As a subsequent operation, impurities, such as N-type impurities are injected to upper portions of the active pillars 322 to form the second source and drain regions 336, as illustrated in FIG. 3.

Figure 38:
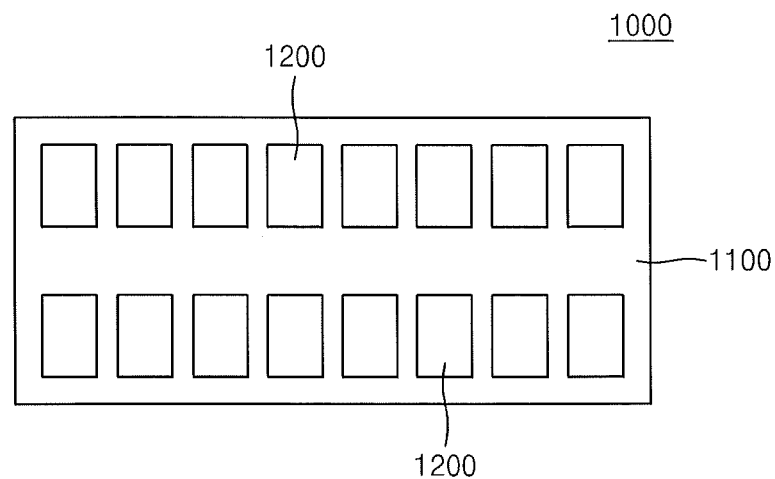

FIG. 38 is a plan view of a memory module 1000 including a semiconductor device according to an embodiment of the inventive concept.

In detail, the memory module 1000 may include a printed circuit board (PCB) 1100, and a plurality of semiconductor packages 1200. The semiconductor packages 1200 may include the semiconductor device according to embodiments of the inventive concept. Specifically, the semiconductor devices 1200 may include at least one selected from the above-described semiconductor devices.

The memory module 1000 may be a single in-line memory module (SIMM) in which the semiconductor packages 1200 are mounted only on a single surface of the PCB 1100, or a dual in-line module (DIMM) in which the semiconductor packages 1200 are mounted on both surfaces of the PCB 1100. The memory module 1000 may be a fully buffered dual in-line memory module (FBDIMM) including advanced memory buffers (AMBs) that respectively provide external signals to the semiconductor packages 1200.

Figure 39:
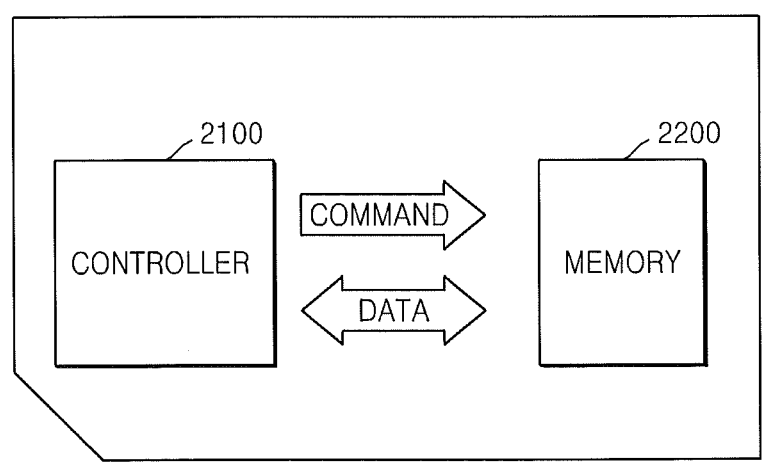
FIG. 39 is a schematic diagram of a memory card including a semiconductor device according to an embodiment of the inventive concept.

FIG. 39 is a schematic diagram of a memory card 2000 including a semiconductor device according to an embodiment of the inventive concept.

In detail, the memory card 2000 may include a controller 2100 and a memory 2200 that are arranged so as to exchange electrical signals. For example, if the controller 2100 issues a command, the memory 2200 may transmit data.

The memory 2200 may include the semiconductor device according to embodiments of the inventive concept. Specifically, the memory 2200 may include at least one selected from the above-described semiconductor devices.

The memory card 2000 may include various kinds of cards, for example, a memory stick card, a smart media card (SM), a secure digital card (SD), a mini-secure digital card (mini SD), and a multimedia card (MMC).

Figure 40:
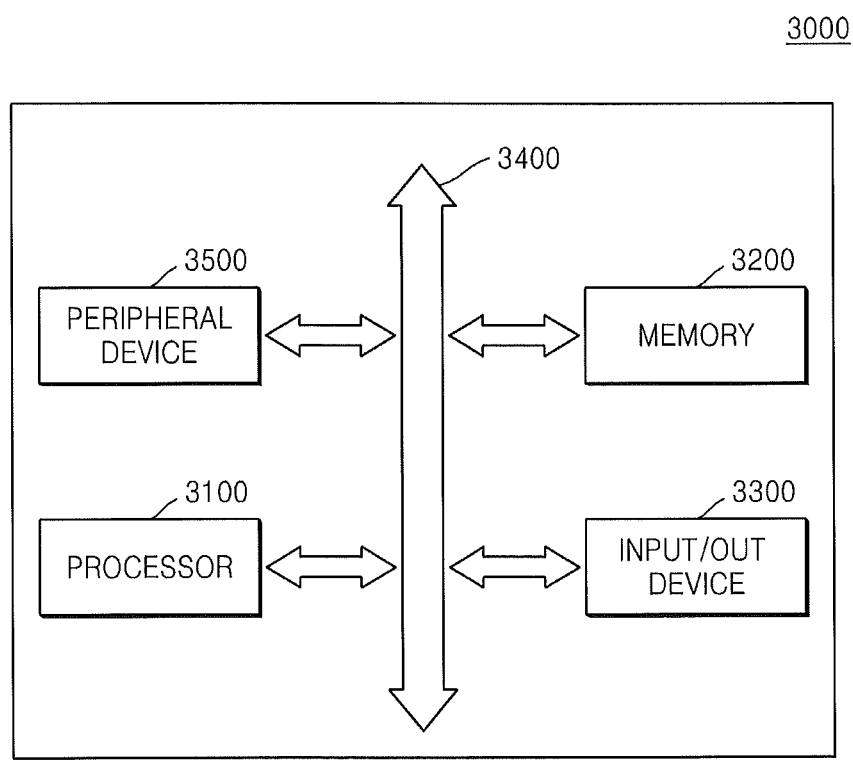
FIG. 40 is a schematic diagram of a system including a semiconductor device according to an embodiment of the inventive concept.

FIG. 40 is a schematic diagram of a system 3000 including a semiconductor device according to an embodiment of the inventive concept.

In detail, the system 3000 may include a processor 3100, a memory 3200, and an input/output device 3300 which may perform data communications through a bus 3400. The memory 3200 of the system 3000 may include a random access memory (RAM), and a read only memory (ROM). In addition, the system 3000 may include a peripheral device 3500 such as a floppy disk drive or a compact disk (CD) ROM drive.

The memory 3200 may include a semiconductor device according to embodiments of the inventive concept. Specifically, the memory 3200 may include at least one selected from the above-described semiconductor devices.

The memory 3200 may store codes and data for operations of the processor 3100. The system 3000 may be used in mobile phones, MP3 players, navigation devices, portable multimedia players (PMPs), solid state disks (SSDs), or household appliances.

While the inventive concept has been particularly shown and described with reference to exemplary embodiments thereof, it will be understood that various changes in form and details may be made therein without departing from the spirit and scope of the following claims.

What is claimed is:

1. An integrated circuit device, comprising:
a plurality of pillars protruding from a substrate in a first direction, each of the pillars including source/drain regions in opposite ends thereof and a channel region extending between the source/drain regions;
a plurality of conductive bit lines on the substrate adjacent the pillars and extending in a second direction substantially perpendicular to the first direction; and
a plurality of conductive shield lines on the substrate and extending in the second direction, each of the shield lines extending between adjacent ones of the bit lines,
wherein the shield lines extend towards the substrate in a direction opposite the first direction beyond the bit lines.

2. The device of claim 1, wherein each of the bit lines electrically contacts a respective one of the source/drain regions of a respective one of the pillars adjacent thereto, and wherein each of the shield lines is electrically insulated from the respective one of the source/drain regions.

3. The device of claim 2, further comprising:
respective shield insulating layers between sidewalls of the shield lines and sidewalls of ones of the bit lines adjacent thereto,
wherein each of the shield lines is electrically insulated from the ones of the bit lines adjacent thereto by the respective shield insulating layers.

4. The device of claim 2, further comprising:
respective air gaps between sidewalls of the shield lines and sidewalls of ones of the bit lines adjacent thereto,
wherein each of the shield lines is electrically insulated from the ones of the bit lines adjacent thereto by the respective air gaps.

5. The device of claim 2, wherein the shield lines do not provide electrical interconnections for the device.

6. The device of claim 2, wherein each of the bit lines extends on the substrate in the second direction adjacent a base of the respective one of the pillars adjacent thereto.

7. The device of claim 1, further comprising:
a plurality of conductive word lines extending in a third direction substantially perpendicular to the first and second directions, wherein each of the word lines extends on ones of the pillars between the source/drain regions thereof.

8. The device of claim 7, wherein the word lines are spaced apart from each other along the second direction, and wherein the bit lines are spaced apart from each other along the third direction.

9. The device of claim 1, wherein the shield lines are directly on the substrate.

10. The device of claim 9, wherein the substrate comprises silicon, and wherein the shield lines comprise epitaxial layers of doped silicon.

11. The device of claim 9, wherein each of the shield lines is provided in a respective trench in the substrate that extends between sidewalls of the adjacent ones of the bit lines.

12. An integrated circuit device, comprising:
a plurality of pillars protruding from a substrate in a first direction, each of the pillars including source/drain regions in opposite ends thereof and a channel region extending between the source/drain regions;
a plurality of conductive bit lines on the substrate adjacent the pillars and extending in a second direction substantially perpendicular to the first direction;
a plurality of conductive shield lines directly on the substrate and extending in the second direction, each of the shield lines extending between adjacent ones of the bit lines; and
a junction oxide layer between the plurality of pillars and the substrate, the junction oxide layer including the plurality of bit lines thereon,
wherein each of the shield lines is provided in a respective trench in the junction oxide layer between sidewalls of the adjacent ones of the bit lines.

13. The device of claim 1, wherein the shield lines further extend away from the substrate in the first direction to a substantially similar level as the bit lines.

14. The device of claim 1, wherein the shield lines further extend away from the substrate in the first direction beyond the bit lines.

15. An integrated circuit device, comprising:
a plurality of pillars protruding from a substrate in a first direction, each of the pillars including source/drain regions in opposite ends thereof and a channel region extending between the source/drain regions;
a plurality of conductive bit lines on the substrate adjacent the pillars and extending in a second direction substantially perpendicular to the first direction; and
a plurality of conductive shield lines on the substrate and extending in the second direction, each of the shield lines extending between adjacent ones of the bit lines
wherein the shield lines comprise first and second shield lines, wherein each of the first shield lines includes shield insulating layers directly on sidewalls of the adjacent ones of the bit lines, and wherein each of the second shield lines is separated from the sidewalls of the adjacent ones of the bit lines by ones of the pillars adjacent thereto.

16. The device of claim 15, wherein the first and second shield lines comprise a same material.

17. The device of claim 1, wherein the shield lines and the bit lines comprise a same material.

18. The device of claim 1, wherein the bit lines and/or the shield lines comprise a metal including tungsten (W), aluminum (Al), copper (Cu), molybdenum (Mo), titanium (Ti), tantalum (Ta), or ruthenium (Ru), and/or a metal nitride including TiN, TiN/W, Ti/TiN, WN, W/WN, TaN, Ta/TaN, TiSiN, TaSiN, or WSiN.

* * * * *